US012651622B2

(12) United States Patent (10) Patent No.: US 12,651,622 B2
Yoon et al. (45) Date of Patent: Jun. 9, 2026

(54) CONTROLLER CONFIGURED TO CONTROL MEMORY DEVICE, OPERATION METHOD OF CONTROLLER, AND STORAGE DEVICE INCLUDING MEMORY DEVICE AND CONTROLLER

(71) Applicant: SAMSUNG ELECTRONICS CO., LTD., Suwon-si (KR)

(72) Inventors: Hojun Yoon, Suwon-si (KR);
Chaekang Lim, Suwon-si (KR);
Seungjin Park, Suwon-si (KR);
Seunghoon Lee, Suwon-si (KR);
Youngdon Choi, Suwon-si (KR);
Junghwan Choi, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 31 days.

(21) Appl. No.: 18/804,524

(22) Filed: Aug. 14, 2024

(65) Prior Publication Data

US 2025/0239282 A1 Jul. 24, 2025

(30) Foreign Application Priority Data

Jan. 22, 2024 (KR) ........................ 10-2024-0009698
Apr. 1, 2024 (KR) ........................ 10-2024-0044062

(51) Int. Cl.
*G11C 7/22* (2006.01)
*G11C 7/10* (2006.01)
(52) U.S. Cl.
CPC ............ *G11C 7/222* (2013.01); *G11C 7/1093* (2013.01); *G11C 2207/2254* (2013.01)
(58) Field of Classification Search
CPC .................. G11C 7/222; G11C 7/1093; G11C 2207/2254; G11C 7/1066
(Continued)

(56) References Cited

U.S. PATENT DOCUMENTS 8,437,216 B2    5/2013    Oh et al.
8,593,901 B2    11/2013    Oh et al.
(Continued)

FOREIGN PATENT DOCUMENTS

CN        116073802        5/2023

OTHER PUBLICATIONS

Na et al., "A 1.8-Gb/s/Pin 16-Tb NAND Flash Memory Multi-Chip Package With F-Chip for High-Performance and High-Capacity Storage", IEEE Journal of Solid-State Circuits, Apr. 2021, 56(4):1129-1140.

*Primary Examiner* — Fernando Hidalgo
(74) *Attorney, Agent, or Firm* — Fish & Richardson P.C.

(57) ABSTRACT

Disclosed is an operation method of a controller which communicates with a plurality of memory devices. The method includes receiving a first reception signal, a second reception signal, and a data strobe signal, respectively, generating a first delay signal by performing first and second per-pin delay locked loop (ppDLL) operations on the first and second reception signals based on a rising edge of the data strobe signal, respectively, and generating first and second correction signals by performing first and second per-pin duty cycle correction (ppDCC) operations on the first and second delay signals based on a falling edge of the data strobe signal, respectively. Rising edges of the first and second correction signals are aligned with the rising edge of the data strobe signal, and first and second falling edges of the first correction signals are aligned with the falling edge of the data strobe signal.

20 Claims, 25 Drawing Sheets

(58) Field of Classification Search
USPC ...................................................... 365/233.1
See application file for complete search history.

(56) References Cited

U.S. PATENT DOCUMENTS

| | | | |
|---|---|---|---|
| 9,563,597 | B2 | 2/2017 | Ware et al. |
| 10,482,937 | B2 | 11/2019 | Lee et al. |
| 11,232,051 | B2 | 1/2022 | Yamamoto et al. |
| 11,677,537 | B2 | 6/2023 | Lee et al. |
| 11,769,537 | B2 | 9/2023 | Jeong et al. |
| 2010/0315119 | A1* | 12/2010 | Welker .................... H04L 25/08 |
| | | | 327/175 |
| 2012/0257466 | A1* | 10/2012 | Kim ..................... H03K 5/1565 |
| | | | 327/175 |
| 2020/0273507 | A1* | 8/2020 | Chae ...................... G11C 7/222 |
| 2021/0082534 | A1 | 3/2021 | Fung et al. |
| 2022/0093157 | A1* | 3/2022 | Park .................... G06F 13/1689 |
| 2024/0212729 | A1* | 6/2024 | Kim ..................... G11C 29/023 |
| 2024/0321330 | A1* | 9/2024 | Kavala ................. G11C 29/028 |

* cited by examiner

[DCC on DQS]

[ppDLL on each DQ using a rising edge of DQS]

[ppDCC on each DQ using a falling edge of DQS]

FIG. 13B

[ppDCC on DQ1 using a falling edge of DQS]

CONTROLLER CONFIGURED TO CONTROL MEMORY DEVICE, OPERATION METHOD OF CONTROLLER, AND STORAGE DEVICE INCLUDING MEMORY DEVICE AND CONTROLLER

CROSS-REFERENCE TO RELATED APPLICATIONS

This application claims priority under 35 U.S.C. § 119 to Korean Patent Application Nos. 10-2024-0009698 filed on Jan. 22, 2024, and 10-2024-0044062 filed on Apr. 1, 2024, in the Korean Intellectual Property Office, the disclosures of which are incorporated by reference herein in their entireties.

BACKGROUND

Embodiments of the present disclosure described herein relate to a semiconductor memory, and more particularly, relate to a controller configured to control a memory device, an operation method of the controller, and a storage device including the memory device and the controller.

A semiconductor memory is classified as a volatile memory, which loses data stored therein when a power is turned off, such as a static random access memory (SRAM) or a dynamic random access memory (DRAM) or a non-volatile memory, which retains data stored therein even when a power is turned off, such as a flash memory, a phase-change RAM (PRAM), a magnetic RAM (MRAM), a resistive RAM (RRAM), or a ferroelectric RAM (FRAM).

A flash memory device is being widely used as a high-capacity storage medium of a computing system. The flash memory device is configured to communicate with a memory controller based on various electrical signals. Electrical signals may be distorted due to various factors occurring during the operation of the flash memory device. In this case, the flash memory device may fail to transmit/receive data normally.

SUMMARY

Embodiments of the present disclosure provide a memory device with improved performance and improved reliability and an operation method thereof.

According to embodiments, an operation method of a controller which communicates with a plurality of memory devices includes receiving a first reception signal, a second reception signal, and a data strobe signal through a first signal pin, a second signal pin, and a third signal pin, respectively, generating a first delay signal by performing a first per-pin delay locked loop (ppDLL) operation on the first reception signal based on a rising edge of the data strobe signal and generating a second delay signal by performing a second ppDLL operation on the second reception signal based on the rising edge of the data strobe signal, and generating a first correction signal by performing a first per-pin duty cycle correction (ppDCC) operation on the first delay signal based on a falling edge of the data strobe signal and generating a second correction signal by performing a second ppDCC operation on the second delay signal based on the falling edge of the data strobe signal. A first rising edge of the first correction signal and a second rising edge of the second correction signal are aligned with the rising edge of the data strobe signal, and a first falling edge of the first correction signal and a second falling edge of the second correction signal are aligned with the falling edge of the data strobe signal.

According to embodiments, a controller which controls a memory device includes a data strobe driver that receives a data strobe signal from the memory device through a data strobe signal line, a first data driver that receives a first data signal from the memory device through a first data line, a first data adjuster that performs a compensation operation on an output of the first data driver, and a first data sampler that samples the first data signal in response to the data strobe signal, and the first data adjuster performs a first per-pin delay locked loop (ppDLL) operation and a first per-pin duty cycle correction (ppDCC) operation on the output of the first data driver based on an output of the first data sampler.

According to embodiments, a storage device includes a first memory device that is connected to a first data line and a second data line, a second memory device that is connected to the first data line and the second data line, and a controller that is connected to the first data line and the second data line and controls the first and second memory devices. The controller receives a first reception signal from the first memory device through the first data line, receives a second reception signal from the second memory device through the second data line, performs a first per-pin delay locked loop (ppDLL) operation and a first per-pin duty cycle correction (ppDLL) operation on the first reception signal, and performs a second ppDLL operation and a second ppDLL operation on the second reception signal. The first ppDLL operation and the second ppDLL operation are simultaneously performed, and the first ppDCC operation and the second ppDCC operation are simultaneously performed.

BRIEF DESCRIPTION OF THE FIGURES

The above and other objects and features of the present disclosure will become apparent by describing in detail embodiments thereof with reference to the accompanying drawings.

FIGS. 13A and 13B are diagrams for describing a first delay locked loop circuit of FIG. 12 and an operation of the first delay locked loop circuit.

DETAILED DESCRIPTION

Below, embodiments of the present disclosure will be described in detail and clearly to such an extent that a person of ordinary skill in the art may easily carry out the present disclosure.

In the detailed description or drawings, function blocks which are expressed by using the terms "unit", "module", etc. may be implemented in the form of hardware, software, or a combination thereof, which is configured to perform a specific function. As an example, a "computing module" may refer to a hardware circuit configured to perform a relevant function or operation disclosed in the detailed description.

Figure 1:
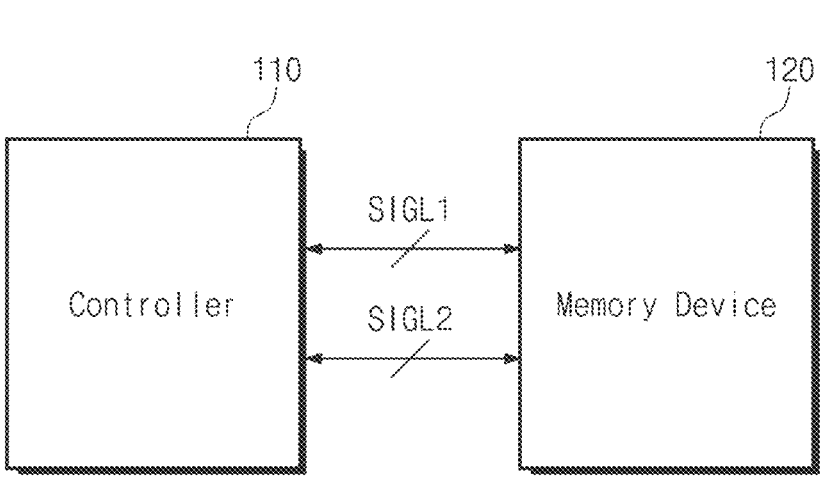
FIG. 1 is a block diagram illustrating a storage device according to embodiments of the present disclosure.

FIG. 1 is a block diagram illustrating a storage device according to embodiments of the present disclosure. Referring to FIG. 1, a storage device 100 may include a controller 110 and a memory device 120. In some embodiments, the storage device 100 may be a high-capacity storage device, which is configured to store data in a computing system, such as a solid state drive (SSD) or a universal flash storage (UFS) card, but the present disclosure is not limited thereto. Alternatively, the storage device 100 may be included in a mobile system such as a mobile phone, a smart phone, a tablet personal computer (PC), a wearable device, a health care device, or an Internet of things (IOT) device. Alternatively, the storage device 100 may be included in a personal computer, a laptop computer, a server, a media player, or an automotive device such as a navigation system.

The controller 110 may be configured to control the memory device 120. For example, the memory controller 110 may store data in the memory device 120 or may read data stored in the memory device 120. For example, the controller 110 may transmit a command CMD and an address ADDR to the memory device 120 through first signal lines SIGL1 and may exchange data "DATA" with the memory device 120 through the first signal lines SIGL1. In some embodiments, the first signal lines SIGL1 may be data signal lines (e.g., DQ lines). The controller 110 may transmit control signals CTRL to the memory device 120 through second signal lines SIGL2. In some embodiments, the control signals CTRL may be used to classify signals exchanged through the first signal lines SIGL1 into the command CMD, the address ADDR, and the data "DATA". However, the present disclosure is not limited thereto.

The memory device 120 may operate under control of the controller 110. For example, in response to signals received from the controller 110, the memory device 120 may store data or may output the stored data. In some embodiments, the memory device 120 may include a flash memory device, but the present disclosure is not limited thereto. For example, the memory device 120 may include various memories such as a dynamic random access memory (DRAM), a static RAM (SRAM), a phase-change RAM (PRAM), a magnetic RAM (MRAM), a resistive RAM (RRAM), or a ferroelectric RAM (FRAM).

In some embodiments, the above communication scheme of the controller 110 and the memory device 120 may be provided only as an example, and the present disclosure is not limited thereto. For example, the controller 110 may transmit a command and an address to the memory device 120 through individual signal lines and may exchange data with the memory device 120 through individual signal lines.

As described above, the controller 110 and the memory device 120 may exchange various signals (e.g., a command, an address, and data) through various signal lines. In this case, various signals may experience signal distortion due to electrical or physical characteristics of various signal lines. Due to the signal distortion, the controller 110 or the memory device 120 may fail to normally recognize the intended information. This may mean that the controller 110 or the memory device 120 operates abnormally.

As an example, the controller 110 may transmit data to the memory device 120 through the first signal lines SIGL1. The first signal lines SIGL1 may include signal lines through which a plurality of data signals DQ and a data strobe signal DQS are transmitted/received. The memory device 120 may identify data received from the controller 110 by sampling (or capturing) the plurality of data signals DQ at the rising edge and the falling edge of the data strobe signal DQS. In this case, when the plurality of data signals DQ and the data strobe signal DQS experience signal distortion, the memory device 120 may fail to identify data normally.

In some embodiments, the controller 110 or the memory device 120 may compensate for the signal distortion, and thus, the reliability of signals may be improved. For example, the memory device 120 may control a delay time of the plurality of data signals DQ such that the plurality of data signals DQ are center-aligned with respect to the data strobe signal DQS. In this case, because the delay time of the plurality of data signals DQ is simply controlled, an effective margin of a data signal may be relatively small.

According to embodiments of the present disclosure, the controller 110 may perform a per-pin delay locked loop (ppDLL) operation on each of the plurality of data signals DQ based on the rising edge of the data strobe signal DQS and may perform a per-pin duty cycle correction (ppDCC) operation on each of the plurality of data signals DQ based on the falling edge of the data strobe signal DQS. In this case, the effective margin of a data signal may increase. In some embodiments, the controller 110 may perform the ppDLL operation and the ppDCC operation on each of the plurality of data signals DQ at the same time or in parallel. In this case, a time for performing a correction operation on the plurality of data signals DQ may be shortened. The operation of the controller 110 according to embodiments of the present disclosure will be described in detail with reference to the following drawings.

Figure 2:
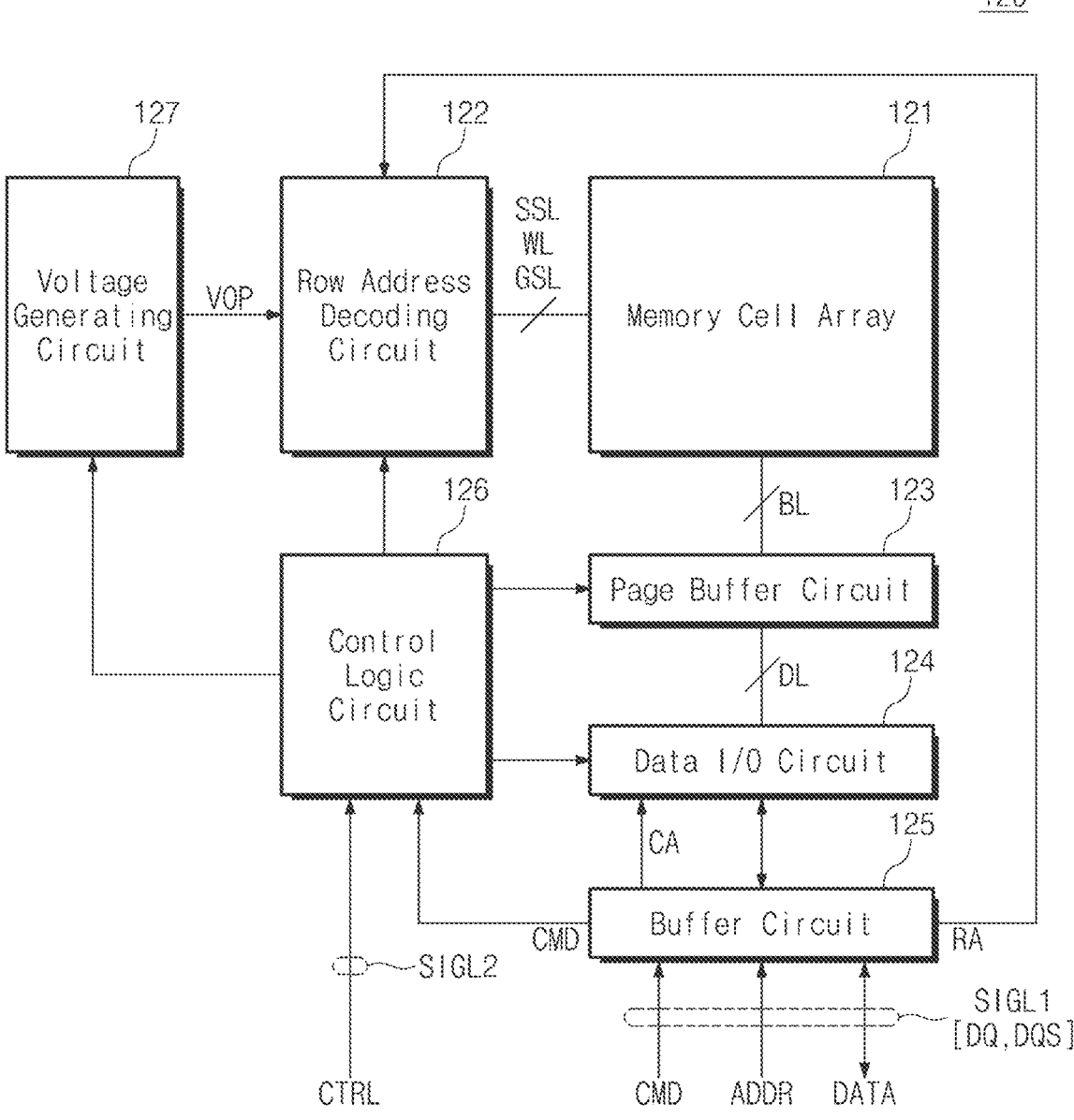
FIG. 2 is a block diagram illustrating a memory device of FIG. 1.

FIG. 2 is a block diagram illustrating a memory device of FIG. 1. Referring to FIGS. 1 and 2, the memory device 120 may include a memory cell array 121, a row address decoding circuit 122, a page buffer circuit 123, a data input/output circuit 124, a buffer circuit 125, a control logic circuit 126, and a voltage generating circuit 127.

The memory cell array 121 may include a plurality of memory blocks. Each of the plurality of memory blocks may include a plurality of cell strings. Each of the plurality of cell strings may include a plurality of cell transistors stacked in a direction perpendicular to a substrate. The plurality of cell transistors may be connected in series between bit lines BL and a common source line. The plurality of cell transistors may be connected to string selection lines SSL, word lines WL, and ground selection lines GSL.

The row address decoding circuit 122 may be connected to the memory cell array 121 through the string selection lines SSL, the word lines WL, and the ground selection lines GSL. The row address decoding circuit 122 may operate under control of the control logic circuit 126. For example, under control of the control logic circuit 126, the row address decoding circuit 122 may decode a row address RA received from the buffer circuit 125; based on a decoding result, the row address decoding circuit 123 may control or drive the string selection lines SSL, the word lines WL, and the ground selection lines GSL or may control voltages applied to the string selection lines SSL, the word lines WL, and the ground selection lines GSL.

The page buffer circuit 123 may be connected to the memory cell array 121 through the bit lines BL. The page buffer circuit 123 may be connected to the data input/output circuit 124 through a plurality of data lines DL. The page buffer circuit 123 may operate under control of the control logic circuit 126. For example, in the program operation of the memory device 120, the page buffer circuit 123 may store data to be programmed in the memory cell array 121 under control of the control logic circuit 126. The page buffer circuit 123 may control voltages of the plurality of bit lines BL based on the stored data and a program verification result. In the read operation of the memory device 120, the page buffer circuit 124 may sense voltages of the bit lines BL and may store the sensed voltages as read data.

The data input/output circuit 124 may be connected to the page buffer circuit 123 through the plurality of data lines DL. The data input/output circuit 124 may receive a column address CA from the buffer circuit 125. The data input/output circuit 124 may transmit the data read by the page buffer circuit 123 to the buffer circuit 124 depending on the column address CA. The data input/output circuit 124 may transmit data received from the buffer circuit 125 to the page buffer circuit 123 based on the column address CA.

The buffer circuit 125 may receive the command CMD and the address ADDR from the controller 110 through the first signal lines SIGL1 and may exchange the data "DATA" with the controller 110 through the first signal lines SIGL1. In some embodiments, the first signal lines SIGL1 may include signal lines through which the plurality of data signals DQ and the data strobe signal DQS are transmitted/received.

The buffer circuit 125 may operate under control of the control logic circuit 126. For example, the control logic circuit 126 may exchange the control signals CTRL with the controller 110 through the first signal lines SIGL1. The control logic circuit 126 may control the buffer circuit 126 based on the control signals CTRL such that the buffer circuit 125 routes the command CMD, the address ADDR, and the data "DATA". Under control of the control logic circuit 126, the buffer circuit 125 may identify signals received through the first signal lines SIGL1 as the command CMD or the address ADDR. The buffer circuit 125 may transfer the command CMD to the control logic circuit 126. The buffer circuit 125 may transfer the row address RA of the address ADDR to the row address decoding circuit 122 and may transfer the column address CA of the address ADDR to the data input/output circuit 124. The buffer circuit 125 may exchange the data "DATA" with the data input/output circuit 124.

The control logic circuit 126 may decode the command CMD received from the buffer circuit 125 and may control the memory device 120 or various components of the memory device 120 based on a decoding result.

Under control of the control logic circuit 126, the voltage generating circuit 127 may generate various operating voltages VOP which are used in the memory device 120. In some embodiments, the operating voltages VOP may include program voltages, pass voltages, selection read voltages, non-selection read voltages, erase voltages, and verify voltages.

Figure 3:
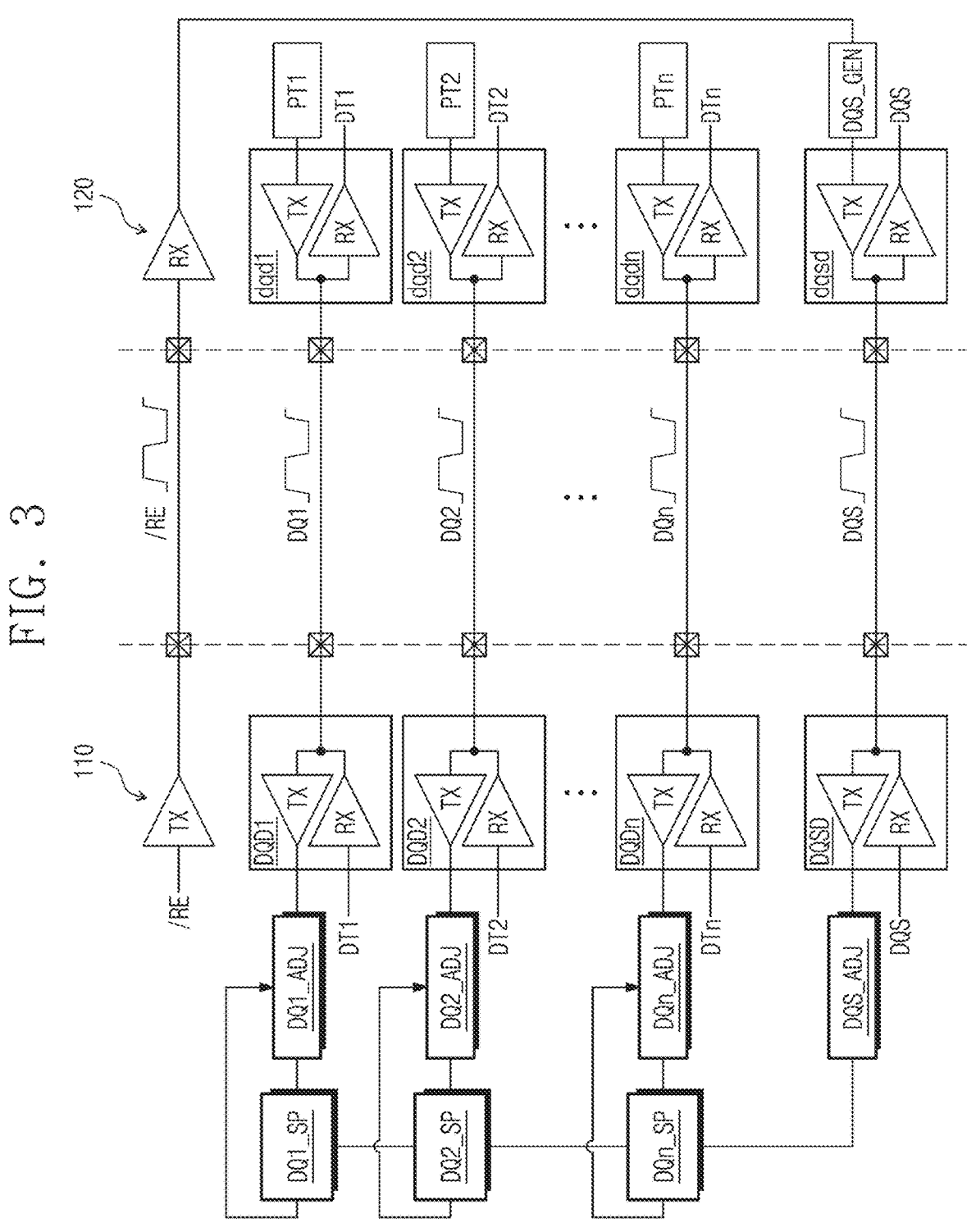
FIG. 3 is a diagram for describing a compensation operation of a storage device of FIG. 1.

FIG. 3 is a diagram for describing a compensation operation of a storage device of FIG. 1. For convenience of description, components which are unnecessary to describe the compensation operation of the storage device 100 are omitted. Referring to FIGS. 1 and 3, the controller 110 may include a plurality of drivers DQD1 to DQDn and DQSD, a plurality of adjusters DQ1_ADJ to DQn_ADJ and DQS-_ADJ, and a plurality of samplers DQ1_SP to DQn_SP. The memory device 120 may include a second plurality of drivers dqd1 to dqdn and dqsd.

The controller 110 and the memory device 120 may exchange signals with each other through the plurality of drivers DQD1 to DQDn, DQSd, dqd1 to dqdn, and dqsd. In this case, signal distortion may be caused by physical characteristics of signal lines or channels through which a plurality of signals are transmitted/received. The controller 110 may perform the compensation operation for compensating for the signal distortion.

For example, in the initialization operation or the compensation operation of the storage device 100, the controller 110 may output a read enable signal/RE through a transmitter TX. The memory device 120 may receive the read enable signal/RE through a receiver RX. A data strobe signal generator DQS_GEN of the memory device 120 may generate the data strobe signal DQS, based on the read enable signal/RE. The generated data strobe signal DQS may be transmitted to the controller 110 through the transmitter TX of the data strobe driver dqsd.

As an example, the memory device 120 may output a plurality of pattern signals PT1 to PTn as a plurality of data signals DQ1 to DQn in synchronization with the data strobe signal DQS. For example, the memory device 120 may output the first pattern signal PT1 as the first data signal DQ1 through the transmitter TX of the first data driver dqd1. The memory device 120 may output the second pattern signal PT2 as the second data signal DQ2 through the transmitter TX of the second data driver dqd2. The memory device 120 may output the n-th pattern signal PTn as the n-th data signal DQn through the transmitter TX of the n-th data driver dqdn. In some embodiments, each of the first to n-th pattern signals PT1 to PTn may be a toggle signal synchronized with the data strobe signal DQS.

The controller 110 may include a plurality of signal pins respectively corresponding to the plurality of data signals DQ1 to DQn and the data strobe signal DQS. Below, for convenience of description, a configuration and description associated with the signal pins will be omitted to avoid redundancy. However, the present disclosure is not limited thereto. For example, the plurality of signal pins may be electrically connected to the memory device 120 through a plurality of signal lines, respectively.

The controller 110 may receive the data signals DQ1 to DQn and the data strobe signal DQS from the memory device 120 and may perform the compensation operation based on the received signals. For example, the controller 110 may receive the data strobe signal DQS through the receiver RX of the data strobe driver DQSD. The data strobe signal DQS may be provided to the data strobe adjuster DQS_ADJ. The data strobe adjuster DQS_ADJ may adjust the duty ratio of the received data strobe signal DQS and may output the data strobe signal DQS with the adjusted duty ratio (i.e., may perform duty cycle correction DCC for the received data strobe signal DQS). The output of the data strobe adjuster DQS_ADJ may be provided to each of the plurality of samplers DQ1_SP to DQn_SP.

The controller 110 may receive the first data signal DQ1 through the receiver RX of the first data driver DQD1. The first data signal DQ1 may be provided to the first data adjuster DQ1_ADJ. The first data adjuster DQ1_ADJ may perform the ppDLL operation and the ppDCC operation on the first data signal DQ1. The output of the first data adjuster DQ1_ADJ may be provided to the first data sampler DQ1_SP. The first data sampler DQ1_SP may sample the output of the first data strobe adjuster DQ1_ADJ in response to the output of the data strobe adjuster DQS_ADJ.

In some embodiments, the output of the first data sampler DQ1_SP may be provided to the first data adjuster DQ1_ADJ. The first data adjuster DQ1_ADJ may perform the ppDLL operation and the ppDCC operation on the first data signal DQ1, based on the output of the first data sampler DQ1_SP. The ppDLL operation and the ppDCC operation according to embodiments of the present disclosure will be described in detail with reference to the following drawings.

Operations of the second to n-th data drivers DQD2 to DQDn, the second to n-th data adjusters DQ2_ADJ to DQn_ADJ, and the second to n-th samplers DQ2_SP to DQn_SP are similar to the above operations of the first data driver DQD1, the first data adjuster DQ1_ADJ, and the first data sampler DQ1_SP, and thus, additional description will be omitted to avoid redundancy.

In some embodiments, the controller 110 may perform the compensation operations (i.e., the ppDLL operations and the ppDCC operations) on the plurality of data signals DQ1 to DQn in parallel or at the same time. Accordingly, a time taken to perform the compensation operations on the plurality of data signals DQ1 to DQn may be shortened.

In some embodiments, the plurality of data adjusters DQ1_ADJ to DQn_ADJ of the controller 110 may perform the compensation operations (i.e., the ppDLL operations and the ppDCC operations) based on the outputs of the plurality of samplers DQ1_SP to DQn_SP. Accordingly, because an additional circuit (e.g., a phase detector and a phase comparator) is not required to perform the compensation operations (i.e., the ppDLL operations and the ppDCC operations), the complexity of the controller 110 may be reduced.

The above embodiment is provided as an example where the controller 110 performs the compensation operation, but the present disclosure is not limited thereto. For example, in the write operation of the storage device 100, the controller 110 may output a plurality of data signals DT1 to DTn through the transmitters TX of the plurality of data drivers DQD1 to DQDn and may output the data strobe signal DQS through the transmitter TX of the data strobe driver DQSD. The memory device 120 may receive the plurality of data DT1 to DTn through the receivers RX of the plurality of data drivers dqd1 to dqdn and may receive the data strobe signal DQS through the receiver RX of the data strobe driver dqsd. The memory device 120 may identify the plurality of data DT1 to DTn, based on the received data strobe signal DQS.

Figure 4:
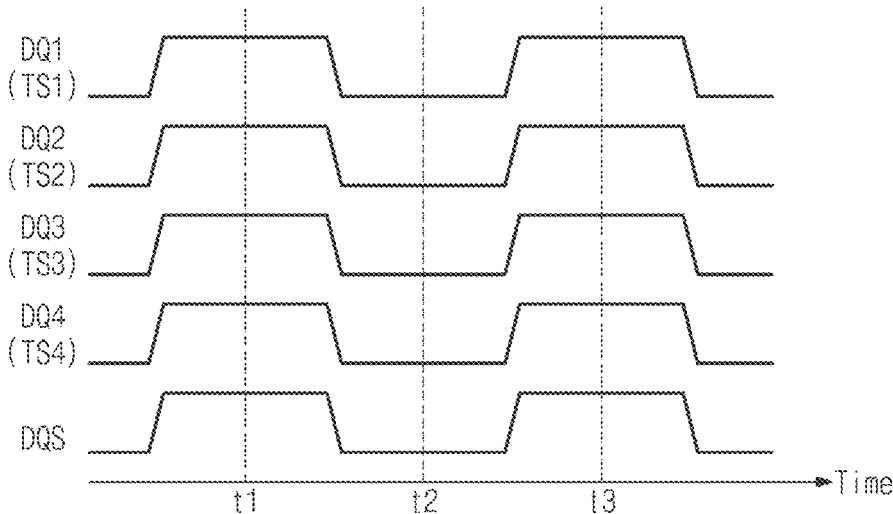
FIG. 4 is a diagram for describing signals which are transmitted from a memory device to a controller in a compensation operation of a storage device of FIG. 1.
Figure 5:
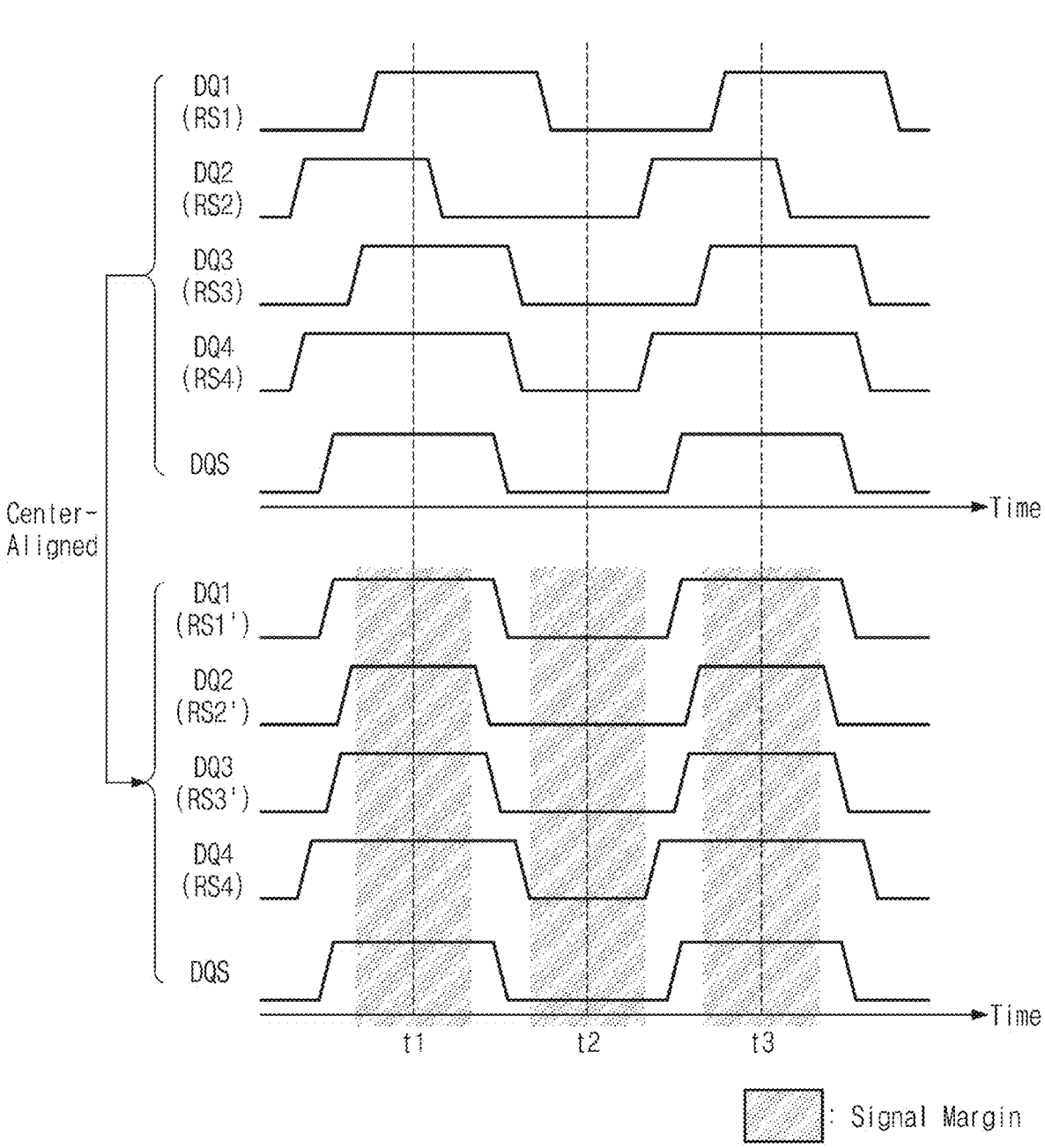
FIG. 5 illustrates graphs for describing signals received from a controller of FIG. 1 and an operation of securing a signal margin of the received signals.

FIG. 4 is a diagram for describing signals which are transmitted from a memory device to a controller in a compensation operation of a storage device of FIG. 1. FIG. 5 illustrates graphs for describing signals received from a controller of FIG. 1 and an operation of securing a signal margin of the received signals. For convenience of description, it is assumed that the memory device 120 transmits the first to fourth data signals DQ1 to DQ4 and the data strobe signal DQS. However, the present disclosure is not limited thereto. For example, the number of data signals between the controller 110 and the memory device 120 may be variously changed.

Also, to describe embodiments of the present disclosure easily, embodiments in which signal distortion is compensated for by the controller 110 will be described. However, the present disclosure is not limited thereto.

First, referring to FIGS. 1 and 4, the memory device 120 may transmit the first to fourth data signals DQ1 to DQ4 and the data strobe signal DQS to the memory device 120. In this case, the first to fourth data signals DQ1 to DQ4 may be output from the memory device 120 like first to fourth transmission signals TS1 to TS4 of FIG. 4. As illustrated in FIG. 4, in embodiments, the data strobe signal DQS may be a signal toggling based on a given frequency. The first to fourth transmission signals TS1 to TS4 may be signals toggling in synchronization with the data strobe signal DQS. The first to fourth transmission signals TS1 to TS4 may be in the shape of being edge-aligned with the rising edge or the falling edge of the data strobe signal DQS. The above signal waveform may be for the compensation operation of the first to fourth data signals DQ1 to DQ4 and the data strobe signal DQS. In the actual operation or the normal operation of the storage device 100, the waveforms of the first to fourth data signals DQ1 to DQ4 may be modified based on data to be transmitted.

In some embodiments, due to an electrical or physical characteristic of a signal line, signals received from the controller 110 may include signal distortion. For example, the memory device 120 may output the first to fourth transmission signals TS1 to TS4 as the first to fourth data signals DQ1 to DQ4 as illustrated in FIG. 4, but the controller 110 may receive first to fourth reception signals RS1 to RS4 as the first to fourth data signals DQ1 to DQ4. For example, the first to fourth reception signals RS1 to RS4 may include signal distortion. In this case, the effective margin of the first to fourth reception signals RS1 to RS4 may decrease.

To increase the effective margin of the first to fourth reception signals RS1 to RS4, the first to fourth DQ drivers DRV_DQ1 to DRV_DQ4 may allow the first to fourth reception signals RS1 to RS4 to be center-aligned with the data strobe signal DQS. In this case, as illustrated in FIG. 5, signal margins of first to fourth reception signals RS1' to RS4' may be secured by center-aligning the signals with data strobe signal DQS.

For example, in the embodiment of FIG. 5, the first to fourth reception signals RS1' to RS4' may be obtained by simply controlling a signal delay time (i.e., by performing a phase control) so as to be center-aligned with the data strobe signal DQS. For this reason, an effective signal margin may correspond to a signal margin being the smallest from among the signal margins of the first to fourth reception signals RS1' to RS4' center-aligned. As a speed (i.e., a frequency) at which data are transmitted between the controller 110 and the memory device 120 increases, it becomes more difficulty to secure the signal margin by using the above method.

According to embodiments of the present disclosure, the plurality of data drivers DQD1 to DQD4 of the controller 110 may respectively perform the ppDLL operations on the first to fourth data signals DQ1 to DQ4 based on the rising edge of the data strobe signal DQS and may perform the ppDCC operations on the first to fourth data signals DQ1 to DQ4 based on the falling edge of the data strobe signal DQS. In this case, signal margins for reception signals may be maximized.

Figure 6:
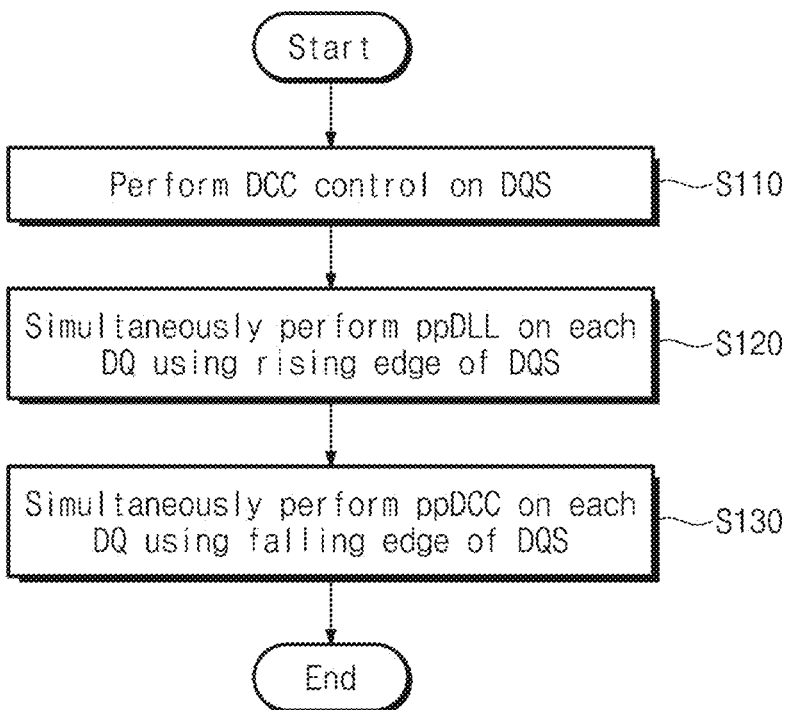
FIG. 6 is a flowchart illustrating an operation of a controller of FIG. 1.

FIG. 6 is a flowchart illustrating an operation of a controller of FIG. 1. Referring to FIGS. 1, 3, and 6, in operation S110, the controller 110 may perform a duty cycle correction (DCC) operation on the data strobe signal DQS. For example, the controller 110 may receive the data strobe signal DQS from the memory device 120. In this case, the data strobe signal DQS may include signal distortion due to an electrical or physical characteristic of a signal line. As an example, in an ideal case (i.e., in the case where there is no signal distortion), the duty ratio of the data strobe signal DQS may be 50%. When the data strobe signal DQS experiences signal distortion, the duty ratio of the data strobe signal DQS may increase or decrease. The data strobe adjuster DQS_ADJ of the controller 110 may control the duty ratio of the data strobe signal DQS received from the memory device 120, so as to be set to 50%.

Below, for convenience of description, it is assumed that the data strobe signal DQS used in the plurality of data drivers DQD1 to DQD4 is a signal whose duty ratio is controlled by the data strobe adjuster DQS_ADJ. In operation S120, the controller 110 may perform the ppDLL operation by using the rising edge of the data strobe signal DQS. For example, the plurality of data adjusters DQ1_ADJ to DQ4_ADJ of the controller 110 may respectively perform the ppDLL operations on the first to fourth reception signals RS1 to RS4. In this case, the rising edge of each of the first to fourth reception signals RS1 to RS4 may be aligned with the rising edge of the data strobe signal DQS.

In operation S130, the memory device 120 may perform the ppDCC operation by using the falling edge of the data strobe signal DQS. For example, through operation S120, the rising edges of the first to fourth reception signals RS1 to RS4 may be in a state of being aligned with the rising edge of the data strobe signal DQS. In this state, the plurality of data adjusters DQ1_ADJ to DQ4_ADJ may control high durations or low durations of the first to fourth reception signals RS1 to RS4 (i.e., may control duty ratios thereof) such that the falling edges of the first to fourth reception signals RS1 to RS4 are aligned with the falling edge of the data strobe signal DQS. In this case, the rising edges of the first to fourth reception signals RS1 to RS4 may be aligned with the rising edge of the data strobe signal DQS, and the falling edges of the first to fourth reception signals RS1 to RS4 may be aligned with the falling edge of the data strobe signal DQS. Accordingly, the signal margin of the first to fourth reception signals RS1 to RS4 may be maximally secured.

To compensate for signal distortion occurring at signal lines or a channel, a conventional controller may allow a plurality of reception signals to be center-aligned with the rising edge or the falling edge of a data strobe signal. In this case, because all signal margins are determined based on a reception signal, whose signal margin is the smallest, from among the plurality of reception signals, an effective signal margin may be relatively small.

In contrast, according to embodiments of the present disclosure, the controller 110 may perform the ppDLL operations on the plurality of reception signals based on the rising edge of the data strobe signal DQS and may perform the ppDCC operations on the plurality of reception signals based on the falling edge of the data strobe signal DQS. In this case, a signal margin may be maximally secured for each of the plurality reception signals, and thus, an effective signal margin may increase. Also, the correction operations respectively corresponding to the plurality of reception signals (i.e., the above delay locked loop control and the above duty cycle correction control) may be simultaneously performed, and thus, a time for the correction operations may be shortened. Accordingly, the performance and reliability of a storage device may be improved.

Figure 7:
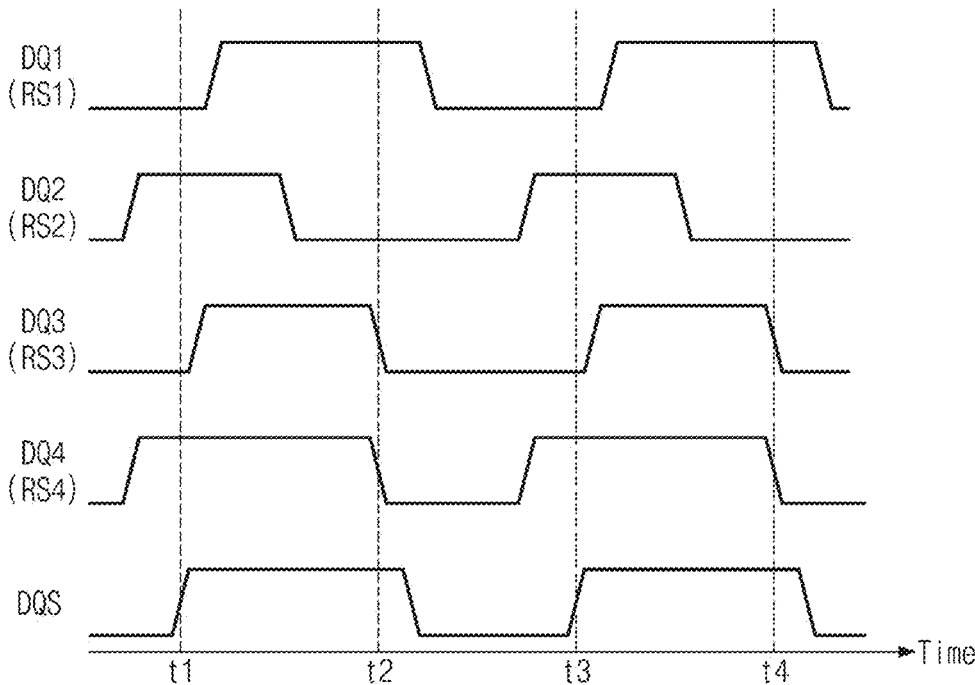
FIGS. 7 and 10 are diagrams for describing an operation according to the flowchart of FIG. 6.
Figure 10:
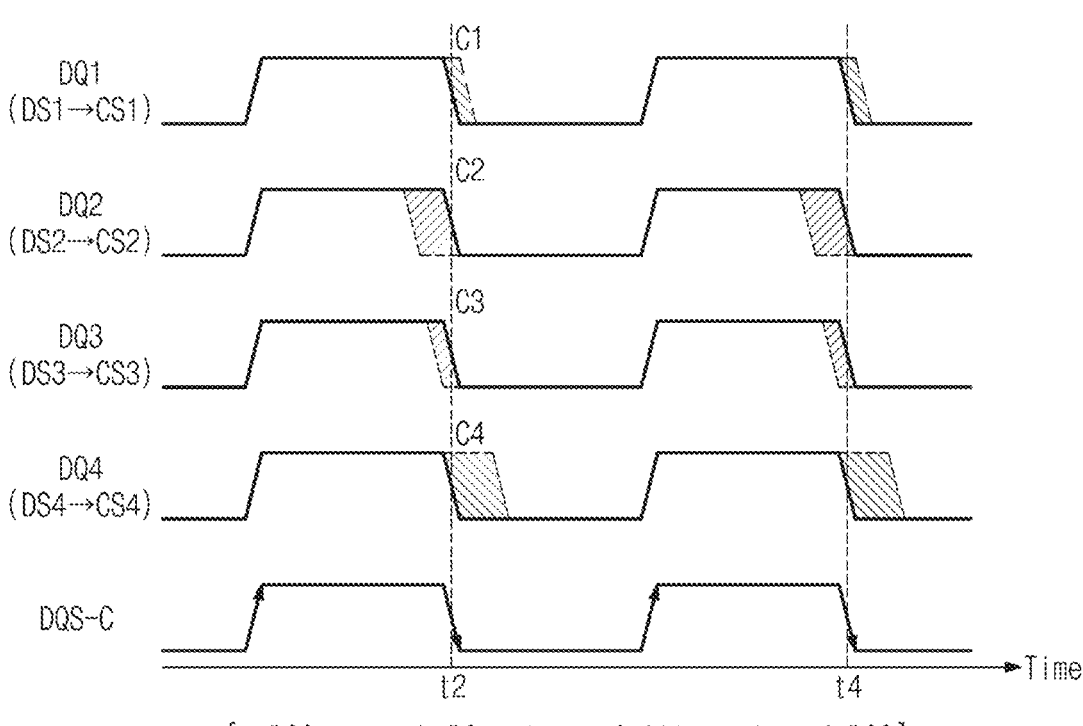

FIGS. 7 and 10 are diagrams for describing an operation according to the flowchart of FIG. 6. For convenience of description, it is assumed that the memory device 120 outputs the first to fourth transmission signals TS1 to TS4 (refer to FIG. 4) as the first to fourth data signals DQ1 to DQ4 and the controller 110 receives the first to fourth reception signals RS1 to RS4 as the first to fourth data signals DQ1 to DQ4. For example, the first to fourth transmission signals TS1 to TS4 may have a given pattern. As an example, the given pattern may be a toggle signal synchronized with the data strobe signal DQS. However, the present disclosure is not limited thereto. For example, the number of data signals DQ between the controller 110 and the memory device 120 may be variously changed or modified. Also, embodiments of the present disclosure may be similarly applied to the compensation operation on various different control signals, as well as the compensation operation on the data signal DQ.

First, referring to FIGS. 1, 3, 6, and 7, the controller 110 may receive the first to fourth data signals DQ1 to DQ4 and the data strobe signal DQS from the memory device 120. For example, as described with reference to FIG. 4, in the initialization operation of the storage device 100, the memory device 120 may transmit the first to fourth transmission signals TS1 to TS4 to the memory device 120 as the first to fourth data signals DQ1 to DQ4. In this case, the first to fourth transmission signals TS1 to TS4 may be signals toggling in synchronization with the data strobe signal DQS.

In contrast, signal distortion may occur due to characteristics of signal lines; in this case, the first to fourth data signals DQ1 to DQ4 actually received by the controller 110 may be the same as the first to fourth reception signals RS1 to RS4 as illustrated in FIG. 7.

As an example, each of first to fourth points of time t1, t2, t3, and t4 may be points in time corresponding to the rising edges and the falling edges of the data strobe signal DQS transmitted from the memory device 120. In this case, the first to fourth reception signals RS1 to RS4 may not be aligned with the first to fourth points of time t1, t2, t3, and t4, and duty ratios of the first to fourth reception signals RS1 to RS4 may be different from each other. Also, the duty ratio of the data strobe signal DQS may change due to the signal distortion.

Next, referring to FIGS. 1, 3, 6, and 8, the controller 110 may perform the duty cycle correction (DCC) operation (e.g., operation S110 of FIG. 6) on the data strobe signal DQS. For example, in an ideal case, the data strobe signal DQS may be a signal which toggles with a given frequency and has the duty ratio of 50%.

In contrast, because the duty ratio of the received data strobe signal DQS is 50% or more (i.e., because the high duration of the received data strobe signal DQS in one cycle is longer), the data strobe adjuster DQS_ADJ of the controller 110 may move the falling edge of the data strobe signal DQS to the second point in time t2. In this case, in one cycle of the data strobe signal DQS, the high duration may relatively decrease, and the low duration may relatively increase. Accordingly, the duty ratio of the data strobe signal DQS may be set to 50%.

Figure 8:
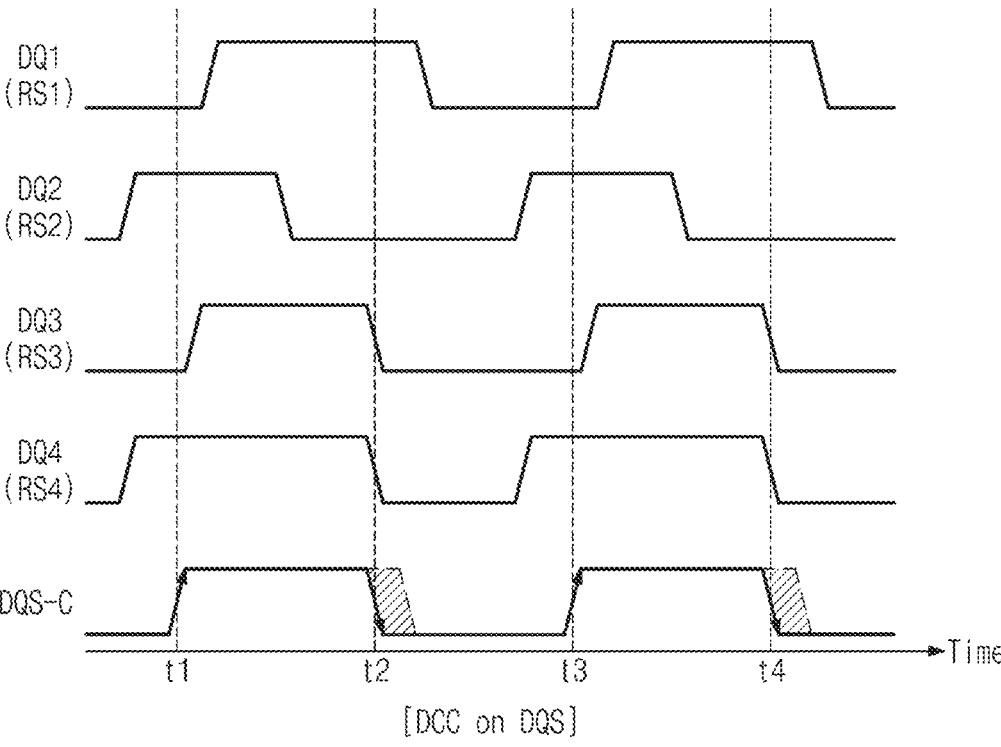
Figure 9:
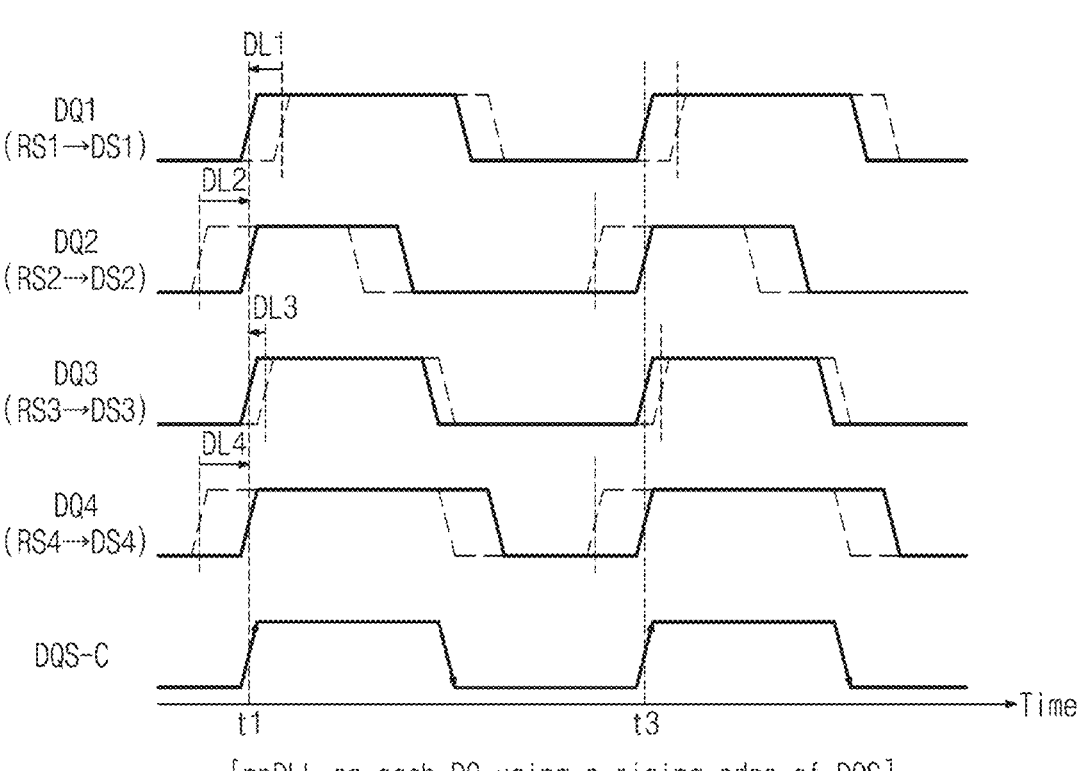

As described above, the controller 110 may perform the DCC operation on the data strobe signal DQS. In this case, the rising edges of the data strobe signal DQS may be located at the first point in time t1 and the third point in time t3, and the falling edges thereof may be located at the second point in time t2 and the fourth point in time t4. Below, for convenience of description, the data strobe signal DQS on which the DCC operation illustrated in FIG. 8 is performed is referred to as a "correction data strobe signal DQS-C". That is, the correction data strobe signal DQS-C may be a signal which experiences the DCC operation after being received from the memory device 120. As will be described below, the controller 110 may perform the compensation operations on a plurality of data signals (or reception signals) by using the correction data strobe signal DQS-C.

Then, referring to FIGS. 1, 3, 6, and 9, the controller 110 may perform the ppDLL operation on each of the first to fourth reception signals RS1 to RS4, based on the rising edge of the correction data strobe signal DQS-C.

As described above, because the first to fourth reception signals RS1 to RS4 include signal distortion, skews may exist between the first to fourth reception signals RS1 to RS4. The first to fourth data adjusters DQ1_ADJ to DQ4_ADJ of the controller 110 may perform the ppDLL operation such that the rising edges of the first to fourth reception signals RS1 to RS4 are aligned with the rising edge of the correction data strobe signal DQS-C.

For example, the first data adjuster DQ1_ADJ may generate a first delay signal DS1 by performing the ppDLL operation on the first reception signal RS1 such that the first reception signal RS1 is advanced as much as a first delay time DL1. The second data adjuster DQ2_ADJ may generate a second delay signal DS2 by performing the ppDLL operation on the second reception signal RS2 such that the second reception signal RS2 is delayed as much as a second delay time DL2. The third data adjuster DQ3_ADJ may generate a third delay signal DS3 by performing the ppDLL operation on the third reception signal RS3 such that the third reception signal RS3 is advanced as much as a third delay time DL3. The fourth data adjuster DQ4_ADJ may generate a fourth delay signal DS4 by performing the ppDLL operation on the fourth reception signal RS4 such that the fourth reception signal RS4 is delayed as much as a fourth delay time DL4. In this case, rising edges of the first to fourth delay signals DS1 to DS4 may be aligned with the rising edge of the correction data strobe signal DQS-C (i.e., may be located at the first point in time t1 or the third point in time t3).

Then, referring to FIGS. 1, 3, 6, and 10, the controller 110 may perform the ppDCC operation on each of the first to fourth delay signals DS1 to DS4, based on the falling edge of the correction data strobe signal DQS-C.

As described above, the first to fourth delay signals DS1 to DS4 may be signals generated by performing the ppDLL operations on the first to fourth reception signals RS1 to RS4. Because the first to fourth reception signals RS1 to RS4 include signal distortion, the first to fourth delay signals DS1 to DS4 may also include the signal distortion (e.g., a duty ratio difference or a jitter).

The first to fourth data adjusters DQ1_ADJ to DQ4_ADJ of the controller 110 may perform the ppDLL operations such that the falling edges of the first to fourth delay signals DS1 to DS4 are aligned with the falling edge of the correction data strobe signal DQS-C.

For example, the first data adjuster DQ1_ADJ may perform the ppDCC operation on the first delay signal DS1 such that the falling edge of the first delay signal DS1 is aligned with the falling edge of the correction data strobe signal DQS-C. The falling edge of the first delay signal DS1 may be advanced as much as a first time C1 through the ppDCC operation on the first delay signal DS1, and thus, a first correction signal CS1 may be generated. In this case, because the rising edge of the first delay signal DS1 is in a fixed state, in one cycle of the first delay signal DS1, the high duration increases as much as the first time C1, and the low duration decreases as much as the first time C1.

The second data adjuster DQ2_ADJ may perform the ppDCC operation on the second delay signal DS2 such that the falling edge of the second delay signal DS2 is aligned with the falling edge of the correction data strobe signal DQS-C. The falling edge of the second delay signal DS2 may be delayed as much as a second time C2 through the ppDCC operation on the second delay signal DS2, and thus, a second correction signal CS2 may be generated. In this case, because the rising edge of the second delay signal DS2 is in a fixed state, in one cycle of the second delay signal DS2, the high duration increases as much as the second time C2, and the low duration decreases as much as the second time C2.

The third data adjuster DQ3_ADJ may perform the ppDCC operation on the third delay signal DS3 such that the falling edge of the third delay signal DS3 is aligned with the falling edge of the correction data strobe signal DQS-C. The falling edge of the third delay signal DS3 may be delayed as much as a third time C3 through the ppDCC operation on the third delay signal DS3, and thus, a third correction signal CS3 may be generated. In this case, because the rising edge of the third delay signal DS3 is in a fixed state, in one cycle of the third delay signal DS3, the high duration increases as much as the third time C3, and the low duration decreases as much as the third time C3.

The fourth data adjuster DQ4_ADJ may perform the ppDCC operation on the fourth delay signal DS4 such that the falling edge of the fourth delay signal DS4 is aligned with the falling edge of the correction data strobe signal DQS-C. The falling edge of the fourth delay signal DS4 may be advanced as much as a fourth time C4 through the ppDCC operation on the fourth delay signal DS4, and thus, a fourth correction signal CS4 may be generated. In this case, because the rising edge of the fourth delay signal DS4 is in a fixed state, in one cycle of the fourth delay signal DS4, the high duration decreases as much as the fourth time C4, and the low duration increases as much as the fourth time C4.

As described above, the first to fourth correction signals CS1 to CS4 may be generated through the ppDCC operations on the first to fourth delay signals DS1 to DS4. The rising edges and the falling edges of the first to fourth correction signals CS1 to CS4 may be edge-aligned with the rising edge and the falling edge of the correction data strobe signal DQS-C.

Figure 11A:
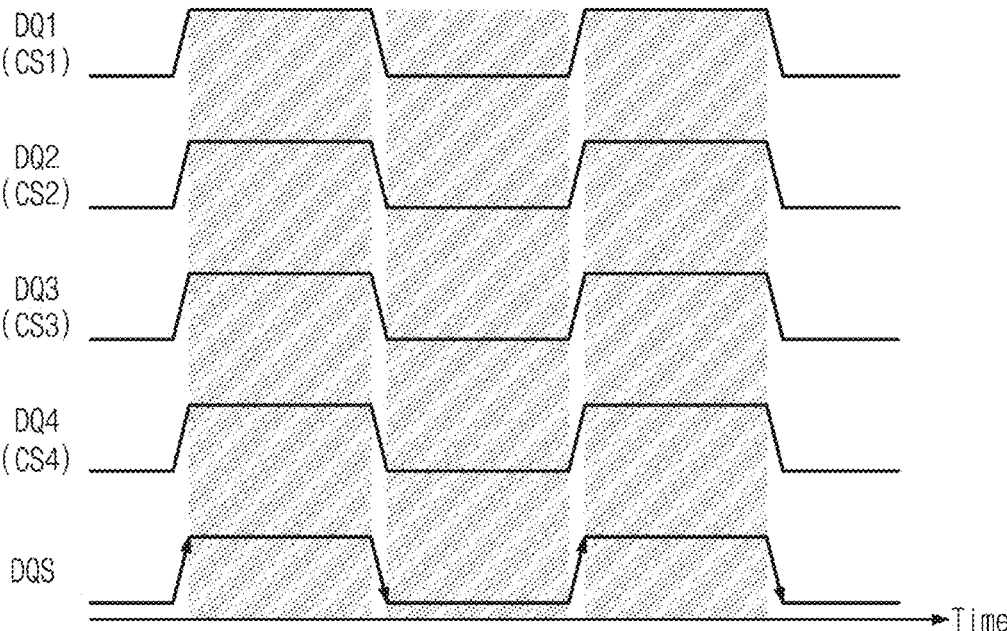
FIGS. 11A and 11B are diagrams for describing an effect of a correction operation according to operations of the flowchart of FIG. 6.
Figure 11B:
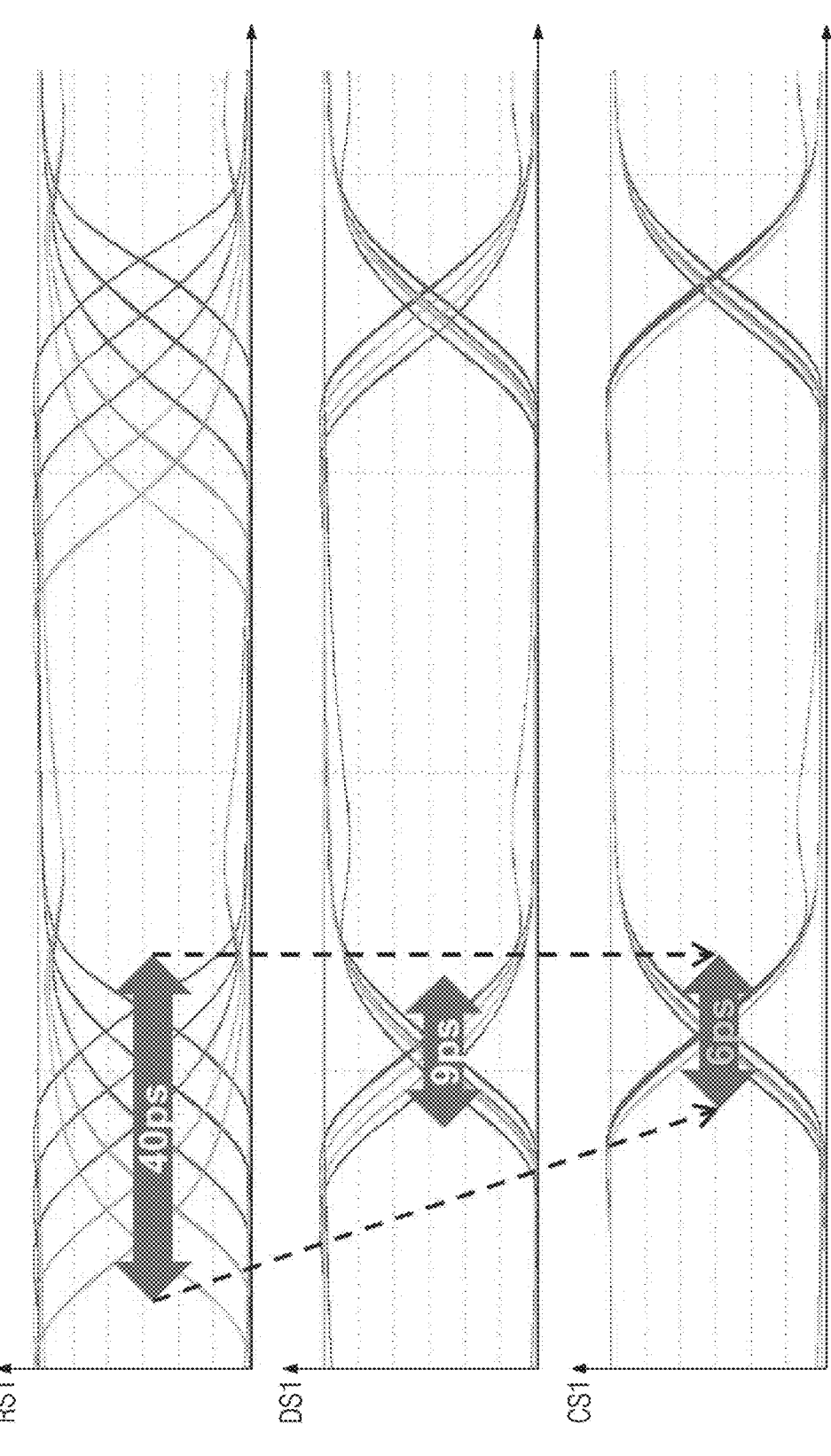

FIGS. 11A and 11B are diagrams for describing an effect of a correction operation according to operations of the flowchart of FIG. 6. As described above, the first to fourth correction signals CS1 to CS4 may be signals obtained through the ppDLL operation and the ppDCC operation. That is, the rising edges and the falling edges of the first to fourth correction signals CS1 to CS4 may be aligned with each other (i.e., may be aligned at the same point in time).

During the operation of the controller 110, the first to fourth correction signals CS1 to CS4 may be generated by performing the compensation operations on the first to fourth reception signals RS1 to RS4. In this case, the compensation operations may be performed based on given compensation information. The given compensation information may be information which is determined or defined through the operations (i.e., the ppDLL operation and the ppDCC operation on each data signal) described with reference to FIGS. 6 to 10 in the process of initializing or training the storage device 100.

Because the rising edges and the falling edges of the first to fourth correction signals CS1 to CS4 are aligned with each other (i.e., are aligned at the same point in time), in the case of sampling the first to fourth correction signals CS1 to CS4 at the rising edge and the falling edge of the data strobe signal DQS, a signal margin according to the sampling may increase relatively as illustrated in FIG. 11A.

As an example, in graphs of FIG. 11B, vertical axes represent the first reception signal RS1, the first delay signal DS1, and the first correction signal CS1, and the horizontal axis represents time. As illustrated in FIG. 11B, a skew of the first reception signal RS1 may be 40 ps. A skew of the first delay signal DS1 may be 9 ps. A skew of the first correction signal CS1 may be 6 ps. That is, signal margins of data signals which are used in data sampling (or data identification) may be improved by performing the ppDLL operation on the first reception signal RS1 by using the rising edge of the correction data strobe signal DQS-C and by performing the ppDCC operation on the first delay signal DS1 by using the falling edge of the correction data strobe signal DQS-C.

Figure 12:
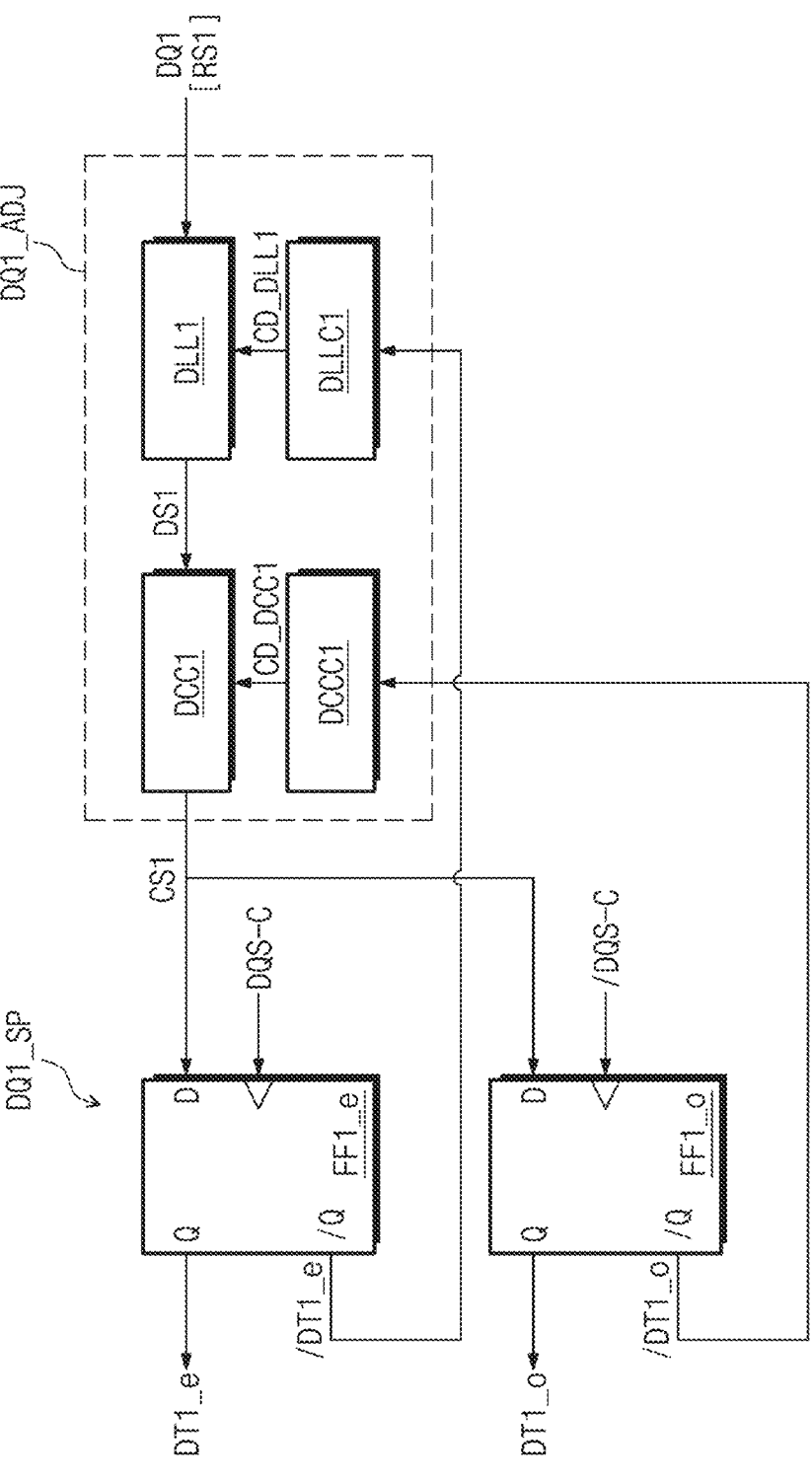
FIG. 12 is a block diagram illustrating a configuration of a first data adjuster and a first data sampler of FIG. 3.

FIG. 12 is a block diagram illustrating a configuration of a first data adjuster and a first data sampler of FIG. 3. For convenience of description, a configuration in which the ppDLL operation and the ppDCC operation on the first reception signal RS1 are performed will be described with reference to a configuration of the first data adjuster DQ1_ADJ and the first data sampler DQ1_SP, but the present disclosure is not limited thereto. For example, structures and operation methods and functions of the remaining data adjusters DQ2_ADJ to DQn_ADJ and the remaining data samplers DQ2_SP to DQn_SP may also be similar to those of the first data adjuster DQ1_ADJ and the first data sampler DQ1_SP.

Referring to FIGS. 1, 3, 10, and 12, the first data adjuster DQ1_ADJ may include a first delay locked loop circuit DLL1, a first duty cycle correction circuit DCC1, a first DLL control circuit DLLC1, and a first DCC control circuit DCCC1. The first data sampler DQ1_SP may include a first even-numbered flip-flop FF1_*e* and a first odd-numbered flip-flop FF1_*o*.

The first delay locked loop circuit DLL1 may receive the first reception signal RS1. The first reception signal RS1 may be a signal received through the receiver RX of the first data driver DQD1 as the first data signal DQ1. The first delay locked loop circuit DLL1 may delay the first reception signal RS1 based on a first DLL code CD_DLL1 and may output the first delay signal DS1 (i.e., may perform the ppDLL operation). The first DLL control circuit DLLC1 may generate the first DLL code CD_DLL1 based on a first inverse even-numbered data/DT1_*e*. Operations of the first delay locked loop circuit DLL1 and the first DLL control circuit DLLC1 will be described in detail with reference to FIGS. 13A and 13B.

The first duty cycle correction circuit DCC1 may receive the first delay signal DS1. The first duty cycle correction circuit DCC1 may output the first correction signal CS1 based on a first DCC code CD_DCC1. The first DCC control circuit DCCC1 may generate the first DCC code CD_DCC1 based on first inverse odd-numbered data/DT1_*o*. Operations of the first duty cycle correction circuit DCC1 and the first DCC control circuit DCCC1 will be described in detail with reference to FIGS. 14A and 14B.

The first even-numbered flip-flop FF1_*e* may sample the first correction signal CS1 in response to the rising edge of the correction data strobe signal DQS-C. A result of the sampling is output as first even-numbered data DT1_*e* and the first inverse even-numbered data/DT1_*e*.

The first odd-numbered flip-flop FF1_*o* may sample the first correction signal CS1 in response to the rising edge of an inverse correction data strobe signal/DQS-C (i.e., corresponding to the falling edge of the correction data strobe signal DQS-C). A result of the sampling is output as first odd-numbered data DT1_*o* and the first inverse odd-numbered data/DT1_*o*.

As described above, the first delay locked loop circuit DLL1 operates based on the first DLL code CD_DLL1, and the first DLL control circuit DLLC1 controls the first DLL code CD_DLL1 based on the output (i.e., /DT1_*e*) of the first even-numbered flip-flop FF1_*e*. That is, the first delay locked loop circuit DLL1 may perform the ppDLL operation based on the rising edge of the correction data strobe signal DQS-C.

The first duty cycle correction circuit DCC1 operates based on the first DCC code CD_DCC1, and the first DCC control circuit DCCC1 controls the first DCC code CD_DCC1 based on the output (i.e., /DT1_*o*) of the first odd-numbered flip-flop FF1_*o*. That is, the first DCC control circuit DCCC1 may perform the ppDCC operation based on the rising edge of the inverse correction data strobe signal/DQS-C (or the falling edge of the correction data strobe signal DQS-C).

As described above, without a separate comparator, the controller 110 may perform the ppDLL operation and the ppDCC operation on the first reception signal RS1 by using the first even-numbered flip-flop FF1_*e* and the first odd-numbered flip-flop FF1_*o* for data sampling, and thus, the structure of the controller 110 may be simplified.

In some embodiments, in the initializing or training process of the controller 110, the first even-numbered flip-flop FF1_*e* and the first odd-numbered flip-flop FF1_*o* operate based on the correction data strobe signal DQS-C and the inverse correction data strobe signal/DQS-C. In contrast, in the normal operation of the controller 110, the first even-numbered flip-flop FF1_*e* and the first odd-numbered flip-flop FF1_*o* may delay the data strobe signal DQS received from the memory device 120 and may identify the first data DT1_*e* and DT1_*o*.

Figure 13A:
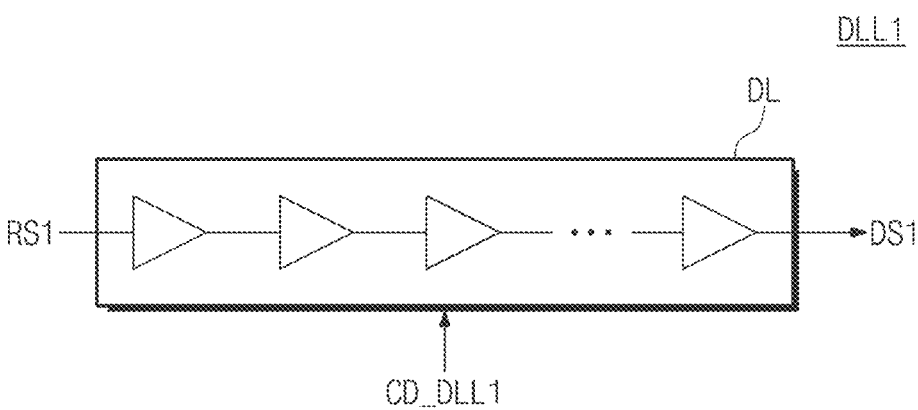
Figure 13B:
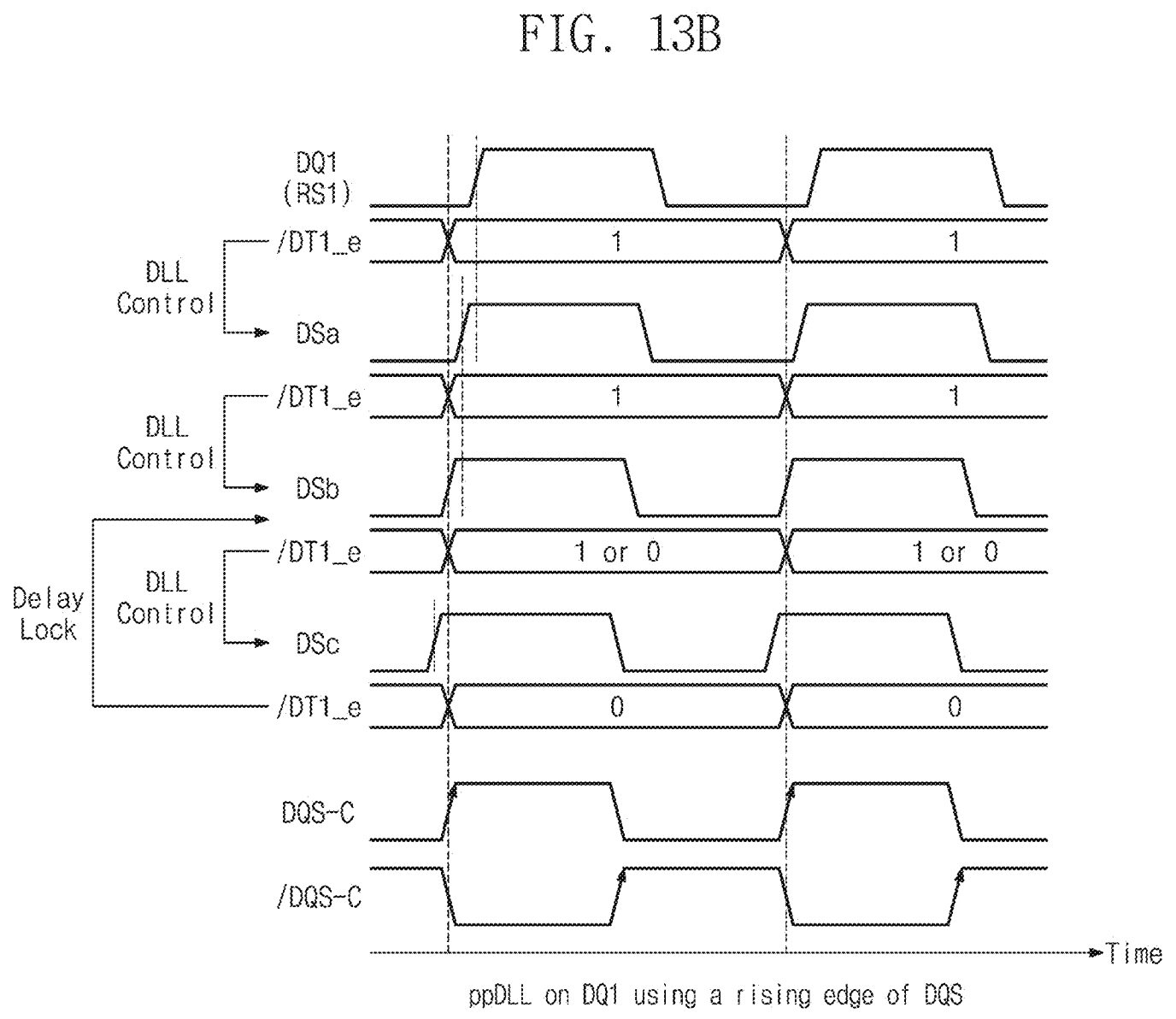

FIGS. 13A and 13B are diagrams for describing a first delay locked loop circuit of FIG. 12 and an operation of the first delay locked loop circuit. In FIG. 13B, the vertical axis represents a delay signal and the first inverse even-numbered data/DT1_*e*, and the horizontal axis represents a time.

Referring to FIGS. 12, 13A, and 13B, the first delay locked loop circuit DLL1 may include a delay line DL. The delay line DL may receive the first reception signal RS1. The delay line DL may delay the first reception signal RS1 in response to the first DLL code CD_DLLC1 from the first DLL control circuit DLLC1 and may output the first delay signal DS1. For example, the delay line DL may include a plurality of delay gates. Each of the plurality of delay gates may be enabled or disabled in response to the first DLL code CD_DLL1. A delay time may be determined depending on the number of enabled delay gates.

As described above, the first DLL control circuit DLLC1 may generate the first DLL code CD_DLL1 based on the first inverse even-numbered data/DT1_e, and the first inverse even-numbered data/DT1_e may be output from the first even-numbered flip-flop FF1_e.

For example, as illustrated in FIG. 13B, when the ppDLL operation and the ppDCC operation are not performed, the first reception signal RS1 may be input to the first even-numbered flip-flop FF1_e. In this case, the first even-numbered flip-flop FF1_e may sample the first reception signal RS1 in response to the rising edge of the correction data strobe signal DQS-C. In this case, the first inverse even-numbered data/DT1_e may be "1".

The first DLL control circuit DLLC1 may generate the first DLL code CD_DLL1 in response to the first inverse even-numbered data/DT1_e of "1" such that the first reception signal RS1 is delayed (or advanced) as much as a given time. In response to the first DLL code CD_DLL1, the first delay locked loop circuit DLL1 may delay the first reception signal RS1 as much as the given time and may generate an a-th delay signal DSa. In this case, the first even-numbered flip-flop FF1_e may sample the a-th delay signal DSa in response to the rising edge of the correction data strobe signal DQS-C. In this case, the first inverse even-numbered data/DT1_e may be "1".

The first DLL control circuit DLLC1 may generate the first DLL code CD_DLL1 in response to the first inverse even-numbered data/DT1_e of "1" such that the a-th delay signal DSa is delayed as much as a given time. In response to the first DLL code CD_DLL1, the first delay locked loop circuit DLL1 may delay the a-th delay signal DSa as much as the given time and may generate a b-th delay signal DSb. In this case, the first even-numbered flip-flop FF1_e may sample the b-th delay signal DSb in response to the rising edge of the correction data strobe signal DQS-C. In this case, the first inverse even-numbered data/DT1_e may be "1" or "0".

The first DLL control circuit DLLC1 may generate the first DLL code CD_DLL1 in response to the first inverse even-numbered data/DT1_e of "1" or "0" such that the b-th delay signal DSb is delayed as much as a given time. In response to the first DLL code CD_DLL1, the first delay locked loop circuit DLL1 may delay the b-th delay signal DSb as much as the given time and may generate a c-th delay signal DSc. In this case, the first even-numbered flip-flop FF1_e may sample the c-th delay signal DSc in response to the rising edge of the correction data strobe signal DQS-C. In this case, the first inverse even-numbered data/DT1_e may be "0".

The first DLL control circuit DLLC1 may determine the first DLL code CD_DLL1 based on the first inverse even-numbered data/DT1_e of "0". The first DLL code CD_DLL1 thus determined may correspond to a DLL code of a point in time when the first inverse even-numbered data/DT1_e is inverted (i.e., is inverted from "1" to "0") (or the inversion from "0" to "1" being possible). The first DLL control circuit DLLC1 may provide the first DLL code CD_DLLC1 thus determined to the delay line DL, and the delay line DL may delay the first reception signal RS1 based on the first DLL code CD_DLLC1 thus determined and may output the first delay signal DS1. In the embodiment of FIG. 13B, the first delay signal DS1 may correspond to the c-th delay signal DSc.

Figure 14A:
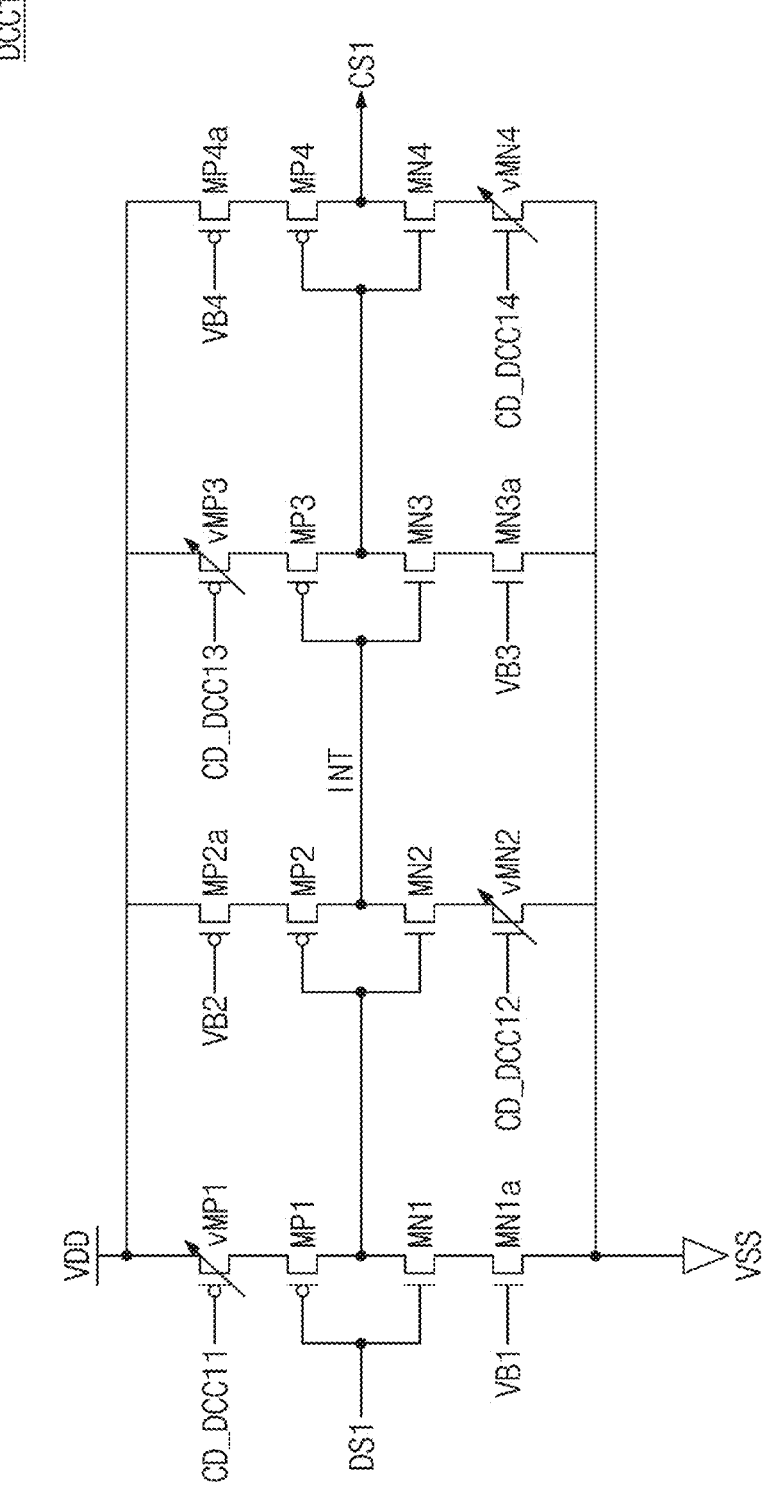
FIG. 14A, FIGS. 14B, and 14C are diagrams for describing an operation of a first duty cycle correction circuit of FIG. 12.
Figure 14B:
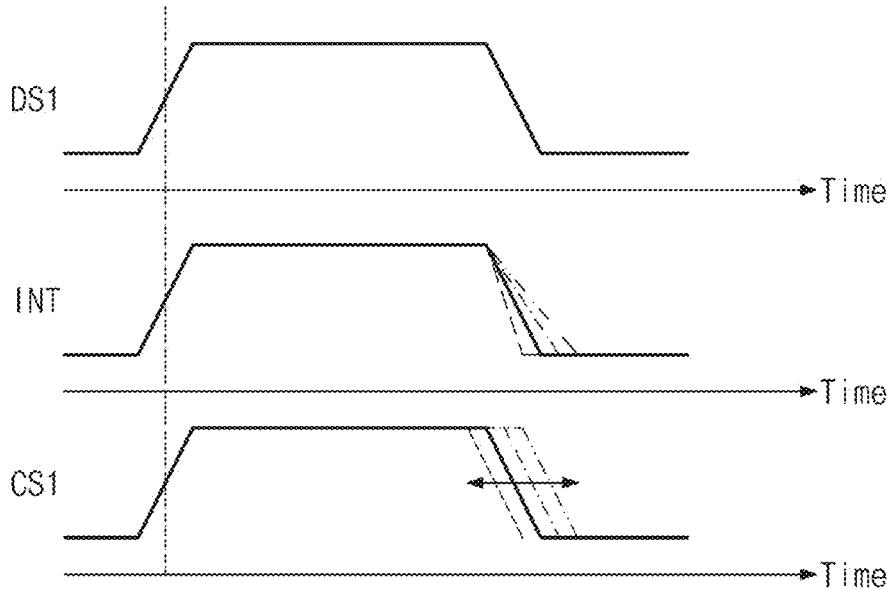
Figure 14C:
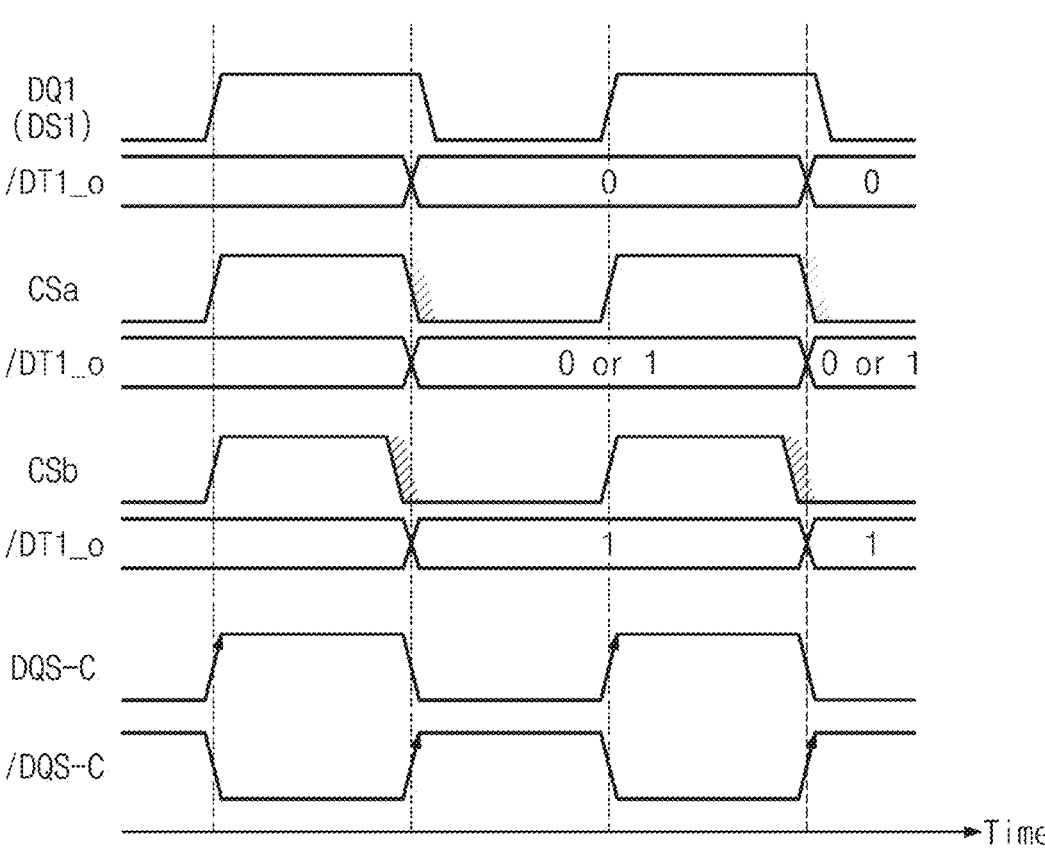

FIGS. 14A, FIGS. 14B, and 14C are diagrams for describing an operation of a first duty cycle correction circuit of FIG. 12. In FIG. 14B, the vertical axis represents an input signal, an intermediate signal, and an output signal of the first duty cycle correction circuit DCC1, and the horizontal axis represents a time. In FIG. 14C, the vertical axis represents a correction signal and the first inverse even-numbered data/DT1_e, and the horizontal axis represents a time.

Referring to FIGS. 12, 14A, 14B, and 14C, the first duty cycle correction circuit DCC1 may include a plurality of transistors MN1 to MN4, MP1 to MP4, vMP1, vMP3, vMN2, vMN4, MN1a, MP2a, MN3a, and MP4a The first variable PMOS transistor vMP1, the first PMOS transistor MP1, the first NMOS transistor MN1, and the 1a-th NMOS transistor MN1a may be connected in series between a power supply voltage VDD and a ground voltage VSS. The 2a-th PMOS transistor MP2a, the second PMOS transistor MP2, the second NMOS transistor MN2, and the second variable NMOS transistor vMN2 may be connected in series between the power supply voltage VDD and the ground voltage VSS. The third variable PMOS transistor vMP3, the third PMOS transistor MP3, the third NMOS transistor MN3, and the 3a-th NMOS transistor MN3a may be connected in series between the power supply voltage VDD and the ground voltage VSS. The 4a-th PMOS transistor MP4a, the fourth PMOS transistor MP4, the fourth NMOS transistor MN4, and the fourth variable NMOS transistor vMN4 may be connected in series between the power supply voltage VDD and the ground voltage VSS.

Gates of the first PMOS transistor MP1 and the first NMOS transistor MN1 may receive the first delay signal DS1. The first variable PMOS transistor vMP1 may operate in response to a 11-th DCC code CD_DCC11. The 1a-th NMOS transistor MN1a may operate in response to a first bias voltage VB1. Gates of the second PMOS transistor MP2 and the second NMOS transistor MN2 may be connected to a node between the first PMOS transistor MP1 and the first NMOS transistor MN1. The 2a-th PMOS transistor MP2a may operate in response to a second bias voltage VB2. The second variable NMOS transistor vMN2 may operate in response to a 12-th DCC code CD_DCC12. Gates of the third PMOS transistor MP3 and the third NMOS transistor MN3 may be connected to a node between the second PMOS transistor MP2 and the second NMOS transistor MN2. The third variable PMOS transistor vMP3 may operate in response to a 13-th DCC code CD_DCC13. The 3a-th NMOS transistor MN3a may operate in response to a third bias voltage VB3. Gates of the fourth PMOS transistor MP4 and the fourth NMOS transistor MN4 may be connected to a node between the third PMOS transistor MP3 and the third NMOS transistor MN3. The 4a-th PMOS transistor MP4a may operate in response to a fourth bias voltage VB4. The fourth variable NMOS transistor vMN4 may operate in response to a 14-th DCC code CD_DCC14.

In some embodiments, the first variable PMOS transistor vMP1, the second variable NMOS transistor vMN2, the third variable PMOS transistor vMP3, and the fourth variable NMOS transistor vMN4 may operate in response to the first DCC code CD_DCC1 output from the first DCC circuit DCC1. In some embodiments, the first DCC code DC_DCC1 may include the plurality of DCC codes CD_DCC11, CD_DCC12, CD_DCC13, and CD_DCC14. In each of the first variable PMOS transistor vMP1, the second variable NMOS transistor vMN2, the third variable PMOS transistor vMP3, and the fourth variable NMOS transistor vMN4, a physical characteristic or a size (e.g., W/L) may be varied depending on the corresponding one of the plurality of DCC codes CD_DCC11, CD_DCC12, CD_DCC13, and CD_DCC14.

For example, the first variable PMOS transistor vMP1 may include a plurality of PMOS transistors connected in parallel, and the plurality of PMOS transistors may be individually turned on/turned off in response to the 11-th DCC code CD_DCC11. The second variable NMOS transistor vMN2 may include a plurality of NMOS transistors connected in parallel, and the plurality of NMOS transistors may be individually turned on/turned off in response to the 12-th DCC code CD_DCC12. The third variable PMOS transistor vMP3 may include a plurality of PMOS transistors connected in parallel, and the plurality of PMOS transistors may be individually turned on/turned off in response to the 13-th DCC code CD_DCC13. The fourth variable NMOS transistor vMN4 may include a plurality of NMOS transistors connected in parallel, and the plurality of NMOS transistors may be individually turned on/turned off in response to the 14-th DCC code CD_DCC14.

As described above, characteristics of variable transistors may be controlled by the first DCC code CD_DCC1 such that the duty ratio of the first delay signal DS1 is controlled, and thus, the first correction signal CS1 may be output.

For example, as illustrated in FIG. 14B, the first delay signal DS1 may be input to the first duty cycle correction circuit DCC1. In this case, characteristics of variable transistors may be controlled depending on the first DCC code CD_DCC1. As such, the slope of the falling edge of an intermediate signal INT may be controlled. As an example, the intermediate signal INT may indicate a signal of the node between the second PMOS transistor MP2 and the second NMOS transistor MN2. When the strength of each of the first variable PMOS transistor vMP1 and the second variable NMOS transistor vMN2 becomes strong (i.e., when the number of transistors turned on from among transistors connected in parallel in each of the first variable PMOS transistor vMP1 and the second variable NMOS transistor vMN2 increases), the absolute value of the slope of the falling edge of the intermediate signal INT may increase (i.e., the signal level may quickly decrease). In contrast, when the strength of each of the first variable PMOS transistor vMP1 and the second variable NMOS transistor vMN2 becomes weak (i.e., when the number of transistors turned on from among transistors connected in parallel in each of the first variable PMOS transistor vMP1 and the second variable NMOS transistor vMN2 decreases), the absolute value of the slope of the falling edge of the intermediate signal INT may decrease (i.e., the signal level may slowly decrease).

When the absolute value of the slope of the intermediate signal INT increases, the duty ratio of the first correction signal CS1 may decrease (i.e., the high duration of the first correction signal CS1 may decrease); when the absolute value of the slope of the intermediate signal INT decreases, the duty ratio of the first correction signal CS1 may increase (i.e., the high duration of the first correction signal CS1 may increase).

As described above, the duty ratio of the first correction signal CS1 may be controlled by controlling the strength of variable transistors of the first duty cycle correction circuit DCC1. In this case, the first duty cycle correction circuit DCC1 controls the duty ratio by moving the falling edge, with the rising edge of the first correction signal CS1 fixed. Accordingly, the characteristic of reliability of signal may be improved.

In some embodiments, as described with reference to FIG. 12, the first inverse odd-numbered data/DT1_$o$ may be output from the first odd-numbered flip-flop FF1_$o$. First, before the ppDCC operation on the first delay signal DS1 is performed, the first delay signal DS1 may be applied to the first odd-numbered flip-flop FF1_$o$. In this case, as illustrated in FIG. 14C, the first odd-numbered flip-flop FF1_$o$ may sample the first delay signal DS1 in response to the rising edge of the inverse correction data strobe signal/DQS-C. In this case, the first inverse odd-numbered data/DT1_$o$ may be "0".

The first DCC control circuit DCCC1 may control the first DCC code CD_DCC1 in response to that the first inverse odd-numbered data/DT1_$o$ is "0". As an example, because there is a need to decrease the high duration of the first delay signal DS1, the first DCC code CD_DCC1 may be controlled such that the strength of variable transistors becomes strong. As such, the falling edge of the first delay signal DS1 may be advanced as much as a given time. In this case, the rising edge of the first delay signal DS1 may be in a fixed state. In other words, in one cycle of the first delay signal DS1, the high duration may decrease. Through the above operation, the first duty cycle correction circuit DCC1 may output an a-th correction signal CSa.

The first odd-numbered flip-flop FF1_$o$ may sample the a-th correction signal CSa in response to the rising edge of the inverse correction data strobe signal/DQS-C. In this case, the first inverse odd-numbered data/DT1_$o$ may be "0" or "1". As in the above description, in this case, the first DCC circuit DCC1 may further control the first DCC code CD_DCC1. As such, the falling edge of the a-th correction signal CSa may be advanced as much as a given time. In other words, in one cycle of the a-th correction signal CSa, the high duration may decrease. Through the above operation, the first duty cycle correction circuit DCC1 may output a b-th correction signal CSb.

The first odd-numbered flip-flop FF1_$o$ may sample the b-th correction signal CSb in response to the rising edge of the inverse correction data strobe signal/DQS-C. In this case, the first inverse odd-numbered data/DT1_$o$ may be "1". That is, because the first inverse odd-numbered data/DT1_$o$ changes from "0" to "1", the first duty cycle correction circuit DCC1 may determine the first DCC code CD_DCC1. In FIG. 14C, the first DCC code CD_DCC1 thus determined may be a code used to generate the a-th correction signal CSa.

In some embodiments, the first DLL code CD_DLL1 described with reference to FIGS. 13A and 13B and the first DCC code CD_DCC1 described with reference to FIGS. 14A and 14B may be stored in a separate storage circuit (e.g., a register or a latch).

In some embodiments, in the normal operation of the memory device 120, the first DLL code CD_DLL1 stored in the separate storage circuit may be provided to the first delay locked loop circuit DLL1, and the first DCC code CD_DCC1 stored therein may be provided to the first duty cycle correction circuit DCC1. The first delay locked loop circuit DLL1 may perform the ppDLL operation based on the first DLL code CD_DLL1, and the first duty cycle correction circuit DCC1 may perform the ppDCC operation based on the first DCC code CD_DCC1. For example, in the normal operation of the controller 110, the controller 110 may receive the first data signal DQ1 from the memory device 120. The first data adjuster DQ1_ADJ of the controller 110 may generate an input signal by performing the ppDLL on the first data signal DQ1 based on the first DLL code CD_DLL1 and performing the ppDCC operation on the first data signal DQ1 based on the first DCC code CD_DCC1. The flip-flops FF1_$e$ and FF1_$o$ may sample the input signal based on a data strobe signal and may output the data DT1_$e$ and DT1_$o$.

As described above, according to embodiments of the present disclosure, the controller 110 may perform the delay locked loop control and the duty cycle correction control on each of a plurality of data signals by using flip-flops (e.g., samplers configured to sample a data signal), without a separate comparator. Accordingly, the performance and reliability of a storage device may be improved.

Figure 15:
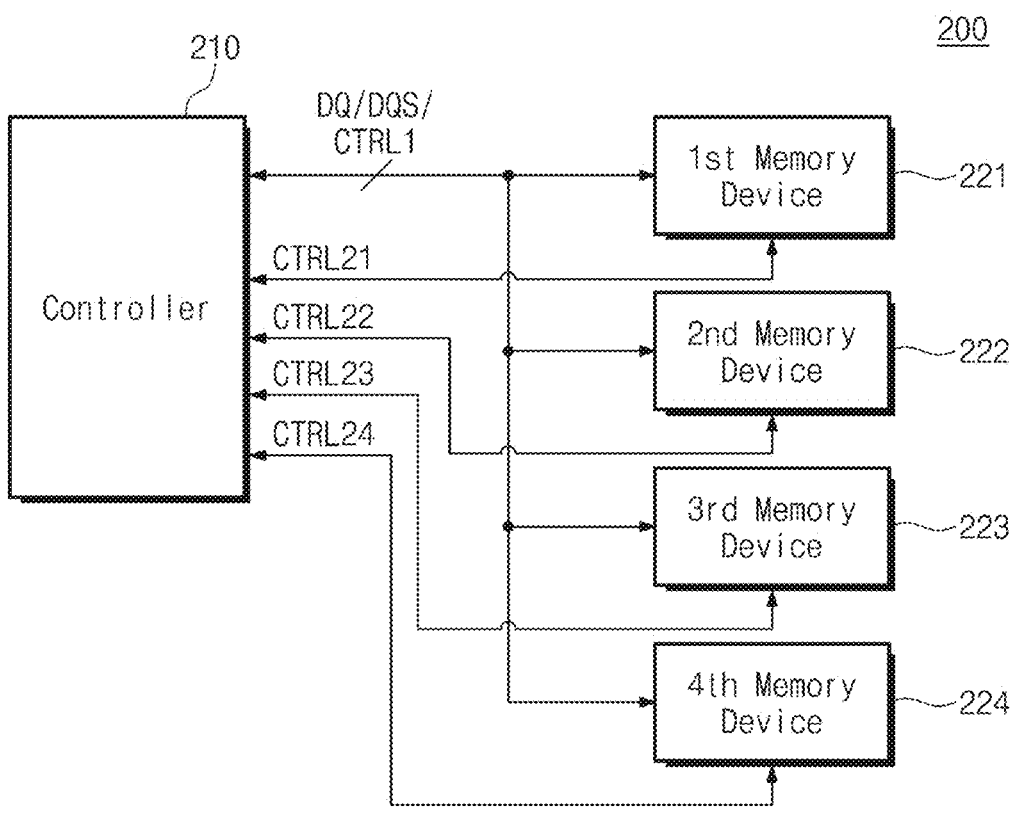
FIG. 15 is a block diagram illustrating a storage device according to embodiments of the present disclosure.

FIG. 15 is a block diagram illustrating a storage device according to embodiments of the present disclosure. Referring to FIG. 15, a storage device 200 may include a controller 210 and a plurality of memory devices 221 to 224. Each of the controller 210 and the plurality of memory devices 221 to 224 is similar to that described above, and thus, additional description will be omitted to avoid redundancy.

In some embodiments, the plurality of memory devices 221 to 224 may share some signal lines. For example, the first memory device 221 may exchange the data signals DQ, the data strobe signal DQS, a first control signal CTRL1, and a 21-th control signal CTRL21 with the controller 210. The second memory device 222 may exchange the data signals DQ, the data strobe signal DQS, the first control signal CTRL1, and a 22-th control signal CTRL22 with the controller 210. The third memory device 223 may exchange the data signals DQ, the data strobe signal DQS, the first control signal CTRL1, and a 23-th control signal CTRL23 with the controller 210. The fourth memory device 224 may exchange the data signals DQ, the data strobe signal DQS, the first control signal CTRL1, and a 24-th control signal CTRL21 with the controller 210.

In some embodiments, the first control signal CTRL1 may include a command latch enable signal CLE, an address latch enable signal ALE, a read enable signal/RE, a write enable signal/WE, etc. The 21-th control signal CTRL21 may include a first chip enable signal CE1 and a first busy signal RB1 for the first memory device 221. The 22-th control signal CTRL22 may include a second chip enable signal CE2 and a second busy signal RB2 for the second memory device 222. The 23-th control signal CTRL23 may include a third chip enable signal CE3 and a third busy signal RB3 for the third memory device 223. The 24-th control signal CTRL24 may include a fourth chip enable signal CE4 and a fourth busy signal RB4 for the fourth memory device 224.

As described above, the first to fourth memory devices 221 and 224 may share some signal lines. In this case, based on a method similar to that described above, the controller 210 may perform the ppDLL operation and the ppDCC operation on each of the first to fourth memory devices 221 to 224.

For example, the controller 210 may perform the first compensation operation (e.g., the ppDLL operation and the ppDCC operation) on the first memory device 221. In this case, as described above, in the first compensation operation, the controller 210 may perform the ppDLL operations and the ppDCC operations on the plurality of data signals DQ at the same time or in parallel. Afterwards, the controller 210 may perform the second compensation operation (e.g., the ppDLL operation and the ppDCC operation) on the second memory device 222. In this case, as described above, in the second compensation operation, the controller 210 may perform the ppDLL operations and the ppDCC operations on the plurality of data signals DQ at the same time or in parallel. The controller 210 may perform the third compensation operation (e.g., the ppDLL operation and the ppDCC operation) on the third memory device 223. In this case, as described above, in the third compensation operation, the controller 210 may perform the ppDLL operations and the ppDCC operations on the plurality of data signals DQ at the same time or in parallel. The controller 210 may perform the fourth compensation operation (e.g., the ppDLL operation and the ppDCC operation) on the fourth memory device 224. In this case, as described above, in the fourth compensation operation, the controller 210 may perform the ppDLL operations and the ppDCC operations on the plurality of data signals DQ at the same time or in parallel.

As described above, the controller 210 may sequentially perform the compensation operations on the plurality of memory devices 221 to 224. In this case, because the compensation operations on the plurality of memory devices 221 to 224 are sequentially performed, a time taken to perform the compensation operations may increase.

In some embodiments, the controller 210 may perform the compensation operation on one of the plurality of memory devices 221 to 224 and may apply a result of the compensation operation to the remaining memory devices. Alternatively, the controller 210 may perform the compensation operations on some data signals in each of the plurality of memory devices 221 to 224 and may apply a result of the compensation operations to the remaining memory devices. For example, the controller 210 may perform a first compensation operation on a first data signal DQ1 for the first memory device 221, and a second compensation operation on a second data signal DQ2 for the second memory device 222. And then the controller may use results of the first and second compensation operations to communicate with each of the first and second memory device 221 and 222. In this case, because the controller 210 does not need to perform all the compensation operations on the plurality of memory devices 221 to 224, a time taken to perform the compensation operations may be shortened.

Figure 16:
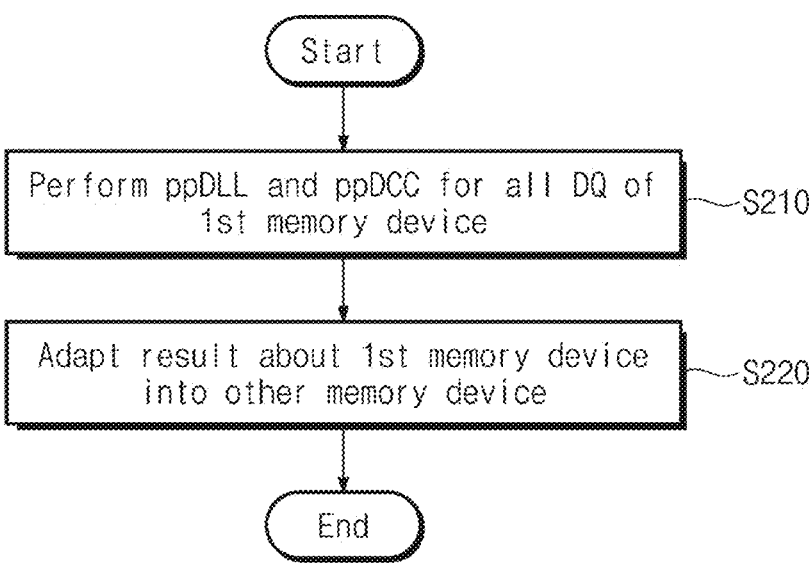
FIG. 16 is a flowchart illustrating an operation of a controller of FIG. 15.

FIG. 16 is a flowchart illustrating an operation of a controller of FIG. 15. Referring to FIGS. 15 and 16, in operation S210, the controller 210 may perform the compensation operation (e.g., the ppDLL operation and the ppDCC operation) on the first memory device 221. For example, based on the method described with reference to FIGS. 1 to 14B, the controller 210 may perform the compensation operation (e.g., the ppDLL operation and the ppDCC operation) on each of the plurality of data signals DQ of the first memory device 221. In this case, the compensation operations (the ppDLL operations and the ppDCC operations) on the plurality of data signals DQ1 to DQn of the first memory device 221 may be in parallel or at the same time.

In operation S220, the controller 210 may apply a result of the compensation operations on the first memory device 221 to each of the remaining memory devices 222 to 224. For example, the controller 210 may store a result (e.g., a DLL code and a DCC code) of the compensation operations on the first memory device 221 in a separate storage circuit. The controller 210 may apply the same result (e.g., a DLL code and a DCC code) to each of the remaining memory devices 222 to 224. In this case, in the normal operation of the storage device 200, the controller 210 may compensate for data signals of each of the remaining memory devices 222 to 224 by using the same DLL code and the same DCC code.

Figure 17:
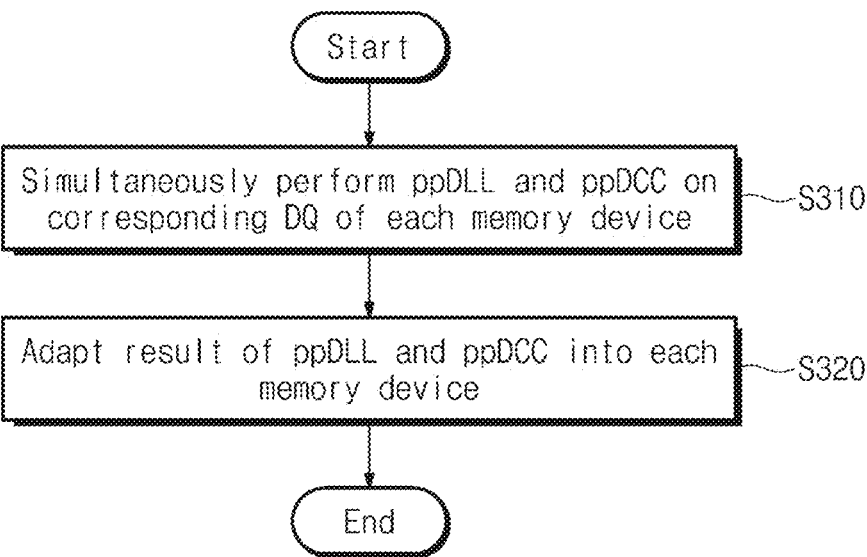
FIG. 17 is a flowchart illustrating an operation of a controller of FIG. 15.
Figure 18:
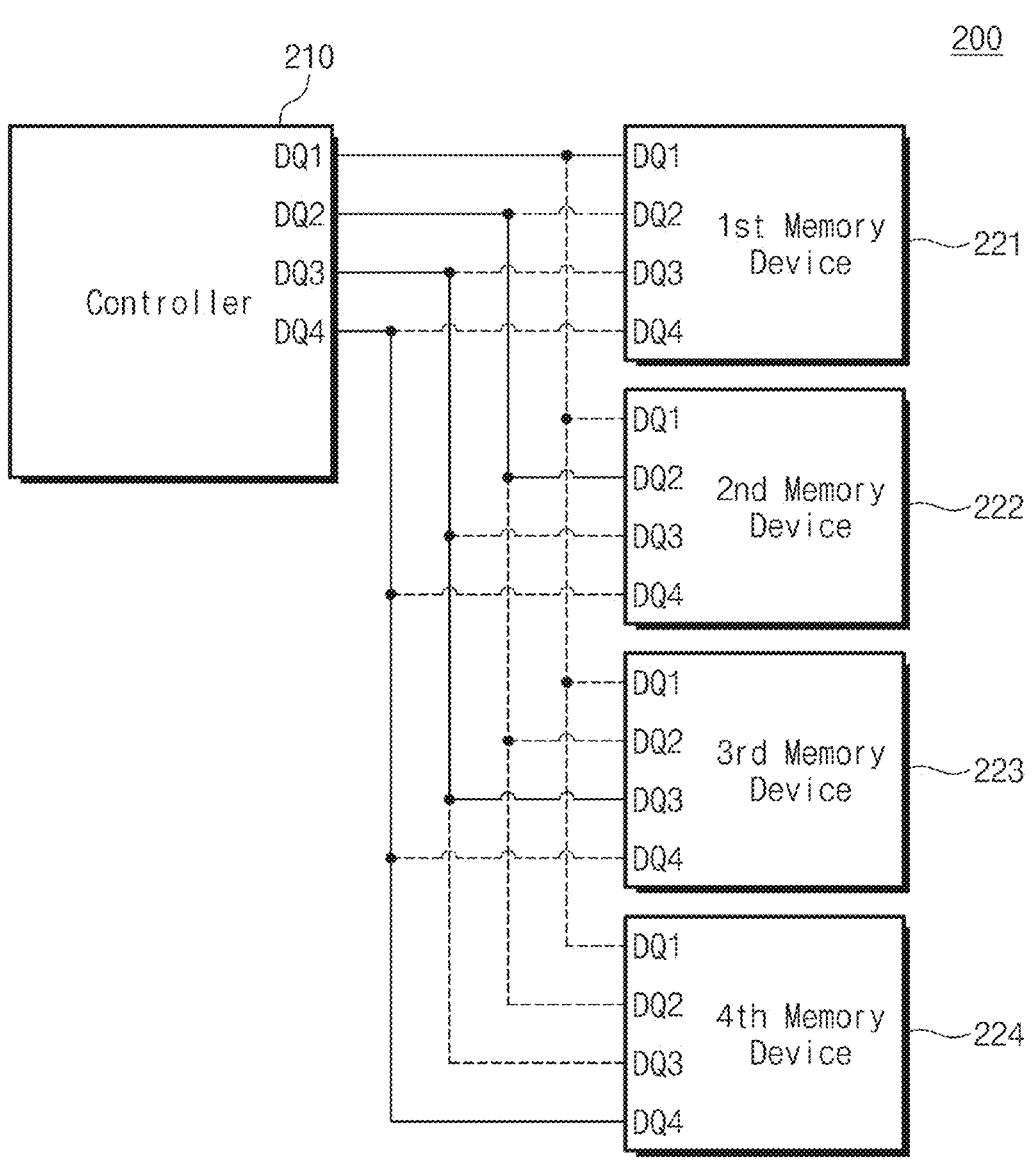
FIG. 18 is a diagram for describing an operation according to the flowchart of FIG. 17.

FIG. 17 is a flowchart illustrating an operation of a controller of FIG. 15. FIG. 18 is a diagram for describing an operation according to the flowchart of FIG. 17. Referring to FIGS. 15 and 17, in operation S310, the controller 210 may perform the compensation operation (e.g., the ppDLL operation and the ppDCC operation) on the corresponding data signal, in each of the plurality of memory devices 221 to 224.

For example, as illustrated in FIG. 18, the controller 110 may simultaneously perform the compensation operations on the first to fourth data signals DQ1 to DQ4. In some embodiments, the first data signal DQ1 may be received from the first memory device 221, the second data signal DQ2 may be received from the second memory device 222, the third data signal DQ3 may be received from the third memory device 223, and the fourth data signal DQ4 may be received from the fourth memory device 224. In this case, the controller 210 may simultaneously perform the compensation operations on different data signals of the plurality of memory devices 221 to 224.

In some embodiments, the ppDLL operations on the plurality of data signals DQ1 to DQ4 may be performed based on the rising edge of the data strobe signal DQS, and the ppDCC operations on the plurality of data signals DQ1 to DQ4 may be performed based on the falling edge of the data strobe signal DQS. In this case, the controller 210 may be configured to receive the data strobe signal DQS from one (e.g., the first memory device 221) of the plurality of memory devices 221 to 224.

In operation S320, the controller 210 may apply results of the compensation operations to the plurality memory devices 221 to 224. For example, during the correction operation, the controller 210 may receive the first data signal DQ1 from the first memory device 221, may receive the second data signal DQ2 from the second memory device 222, may receive the third data signal DQ3 from the third memory device 223, and may receive the fourth data signal DQ4 from the fourth memory device 224. In this case, there may not be performed the compensation operations on the second, third, and fourth data signals DQ2 to DQ4 of the first memory device 221, the second, third, and fourth data signals DQ2 to DQ4 of the second memory device 222, the second, third, and fourth data signals DQ2 to DQ4 of the third memory device 223, and the second, third, and fourth data signals DQ2 to DQ4 of the fourth memory device 224. The controller 210 may apply results of the compensation operations in operation S320 to different memory devices 221 to 224. In this case, the result of the compensation operation on the first data signal DQ1 of the first memory device 221 may be applied to the first data signal DQ1 of the second, third, and fourth memory devices 222, 223, and 224; the result of the compensation operation on the second data signal DQ2 of the second memory device 222 may be applied to the second data signal DQ2 of the first, third, and fourth memory devices 221, 223, and 224; the result of the compensation operation on the third data signal DQ3 of the third memory device 223 may be applied to the third data signal DQ3 of the first, second, and fourth memory devices 221, 222, and 224; and the result of the compensation operation on the fourth data signal DQ4 of the fourth memory device 224 may be applied to the fourth data signal DQ4 of the first, second, and third memory devices 221, 222, and 223.

As described above, according to embodiments of the present disclosure, in association with a plurality of data signals of a memory device, a controller may perform the ppDLL operation based on the rising edge of the data strobe signal DQS and may perform the ppDCC operation based on the falling edge of the data strobe signal DQS. In this case, the above operations on the plurality of data signals DQ may be performed in parallel or at the same time.

Also, according to embodiments of the present disclosure, the controller may share signal lines, which transmit/receive data signals, with the plurality of memory devices. In this case, the controller may perform the compensation operation (i.e., the ppDLL operation and the ppDCC operation) on one of the plurality of memory devices and may apply a result of the compensation operation to the remaining memory devices. Alternatively, the controller may perform the compensation operations (i.e., the ppDLL operations and the ppDCC operations) on signal lines respectively corresponding to the plurality of memory devices at the same time or in parallel and may apply results of the compensation operations to different data signals of different memory devices. Accordingly, a correction operation time of a storage device may be shortened, and the reliability of the storage device may be improved.

Figure 19:
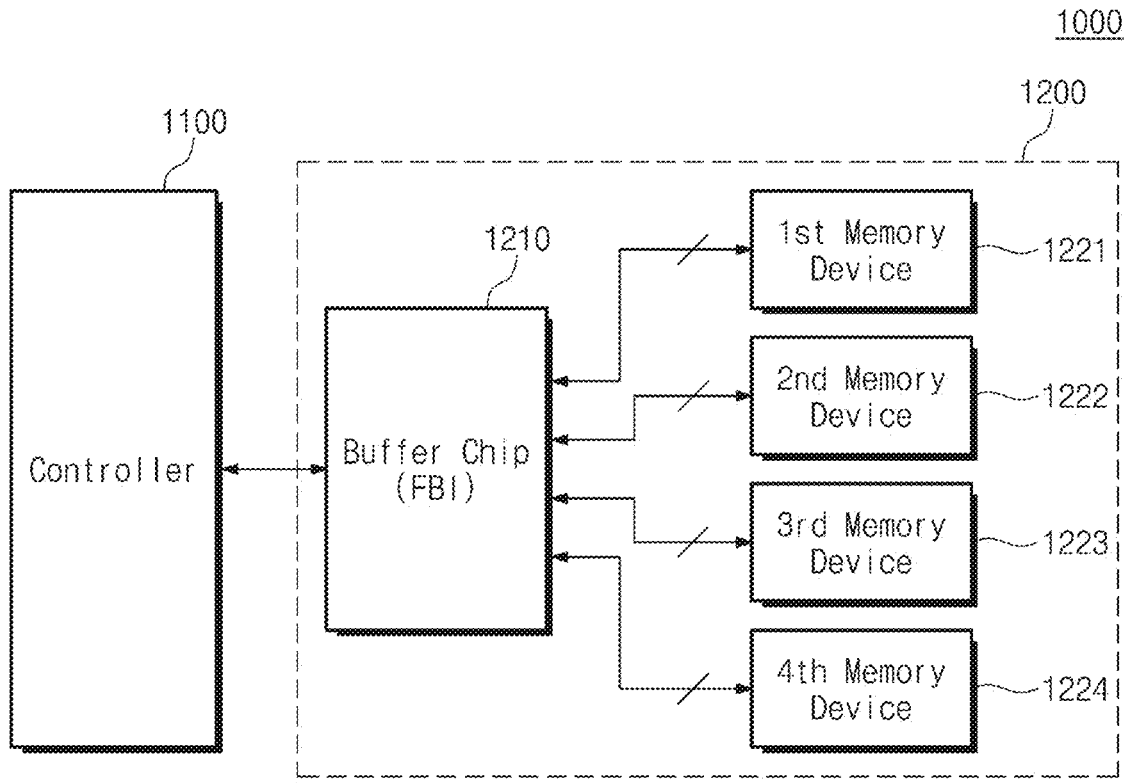
FIG. 19 is a block diagram illustrating a storage device according to embodiments of the present disclosure.

FIG. 19 is a block diagram illustrating a storage device according to embodiments of the present disclosure. Referring to FIG. 19, a storage device 1000 may include a controller 1100 and a memory package 1200. The controller 1100 may be configured to store data in the memory package 1200 or to read data stored in the memory package 1200.

The memory package 1200 may include a buffer chip 1210 and a plurality of memory devices 1221 to 1224. The buffer chip 1210 may be configured to amplify signals received from the controller 1100 and to provide the amplified signals to the plurality of memory devices 1221 to 1224. Alternatively, the buffer chip 1210 may be configured to amplify signals received from the plurality of memory devices 1221 to 1224 and to provide the amplified signals to the controller 1100. In some embodiments, the buffer chip 1210 may be a frequency booster interface (FBI) circuit.

In some embodiments, signal distortion may be caused between the controller 1100 and the buffer chip 1210. Each of the buffer chip 1210 and the controller 1100 may perform the compensation operation (i.e., the ppDLL operation and the ppDCC operation on each data signal), as described above, to compensate for the signal distortion. Signal distortion may be caused between the buffer chip 1210 and the plurality of memory devices 1221 to 1224. The buffer chip 1210 may perform the compensation operation (i.e., the ppDLL operation and the ppDCC operation on each data signal), as described above, to compensate for the signal distortion.

Figure 20:
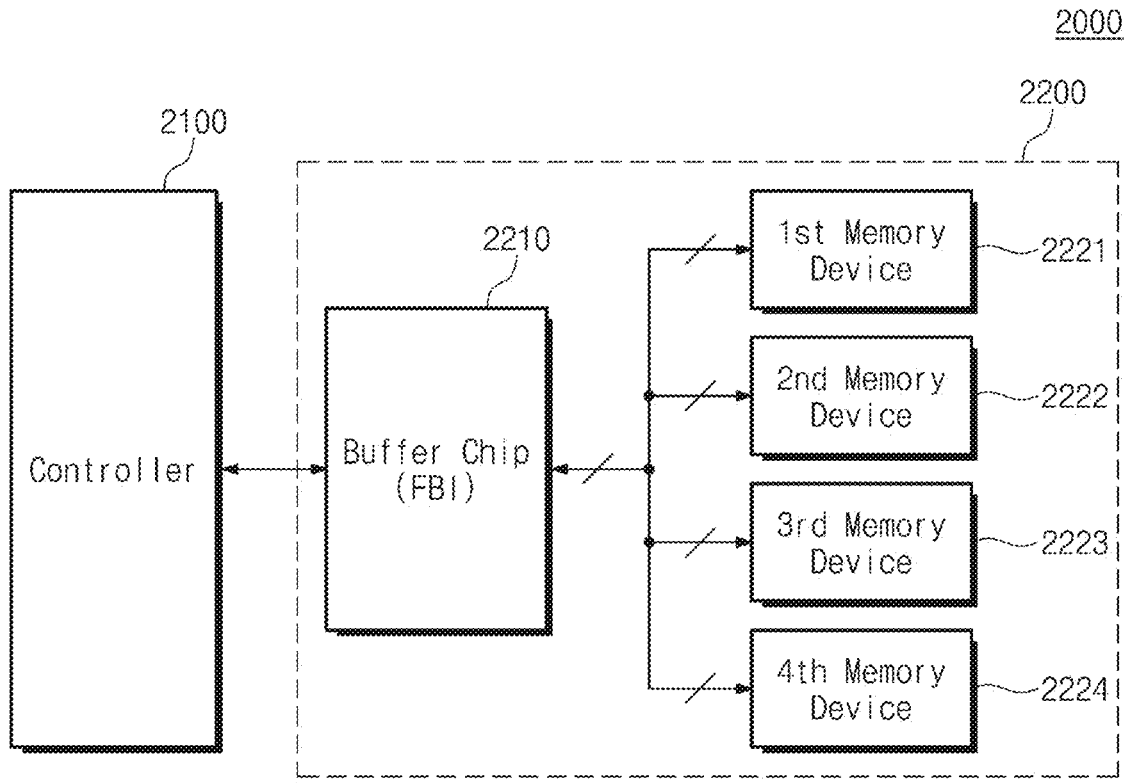
FIG. 20 is a block diagram illustrating a storage device according to embodiments of the present disclosure.

FIG. 20 is a block diagram illustrating a storage device according to embodiments of the present disclosure. Referring to FIG. 20, a storage device 2000 may include a controller 2100 and a memory package 2200. The controller 2100 may be configured to store data in the memory package 2200 or to read data stored in the memory package 2200.

The memory package 2200 may include a buffer chip 2210 and a plurality of memory devices 2221 to 2224. The buffer chip 2210 may amplify and transfer signals which are exchanged between the controller 2100 and the plurality of memory devices 2221 to 2224.

In some embodiments, signal distortion may be caused between the controller 2100 and the buffer chip 2210. Each of the buffer chip 2210 and the controller 2100 may perform the compensation operation (i.e., the ppDLL operation and the ppDCC operation on each data signal), as described above, to compensate for the signal distortion. Signal distortion may be caused between the buffer chip 2210 and the plurality of memory devices 2221 to 2224. Each of the buffer chip 2210 and the plurality of memory devices 2221 to 2224 may perform the compensation operation (i.e., the ppDLL operation and the ppDCC operation on each data signal), as described above, to compensate for the signal distortion.

In the embodiment of FIG. 19, the buffer chip 1210 communicates with the plurality of memory devices 2221 to 2224 through individual channels or individual signal lines.

In contrast, in the embodiment of FIG. 20, the buffer chip 2210 may communicate with the plurality of memory devices 2221 to 2224 through the same channel or the same signal lines. That is, the plurality of memory devices 2221 to 2224 may share the same channel or the same signal lines.

In some embodiments, the buffer chip 2210 may perform the above compensation operations on a plurality of data signals at the same time or in parallel. The buffer chip 2210 may perform the above compensation operations at the same time or in parallel. Accordingly, a compensation operation time may be shortened.

In some embodiments, the compensation operation of the buffer chip 2210 may be similar to the compensation operation of the controller 210 described with reference to FIGS. 15 to 18.

Figure 21:
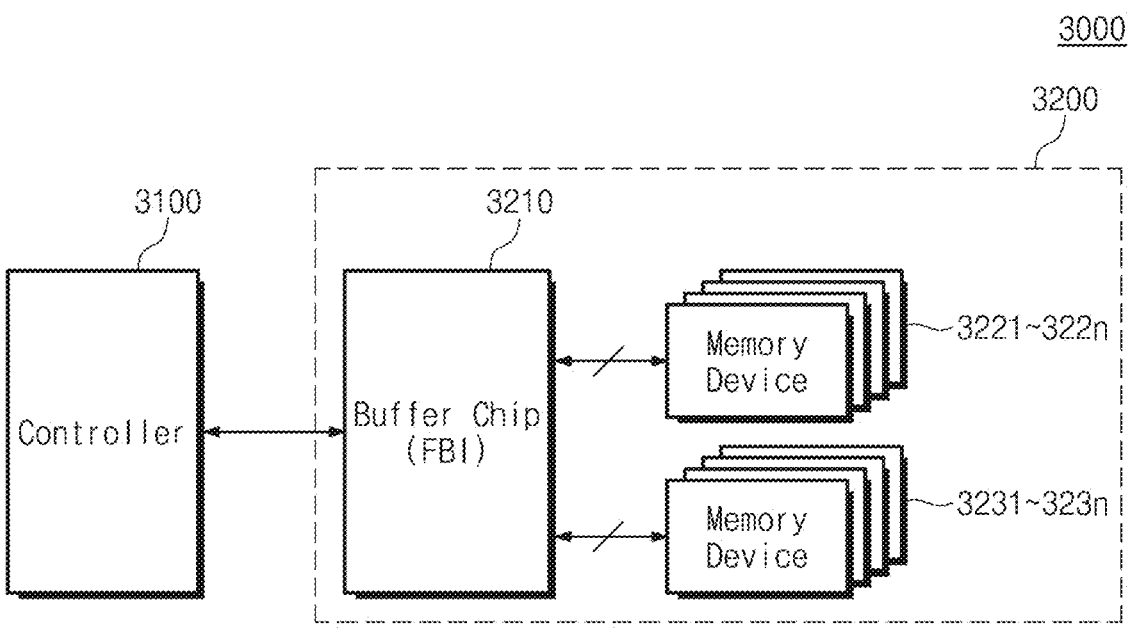
FIG. 21 is a block diagram illustrating a storage device according to embodiments of the present disclosure.

FIG. 21 is a block diagram illustrating a storage device according to embodiments of the present disclosure. Referring to FIG. 21, a storage device 3000 may include a controller 3100 and a memory package 3200. The controller 3100 may be configured to store data in the memory package 3200 or to read data stored in the memory package 3200.

The memory package 3200 may include a buffer chip 3210, a plurality of first memory devices 3221 to 322n, and a plurality of second memory devices 3231 to 323n. The buffer chip 3210 may amplify and transfer signals which are exchanged between the controller 3100 and the plurality of first memory devices 3221 to 322n and between the controller 3100 and the plurality of second memory devices 3231 to 323n.

In some embodiments, the buffer chip 3210 may communicate with the plurality of first memory devices 3221 to 322n through a first channel and may communicate with the plurality of second memory devices 3231 to 323n through a second channel. That is, the plurality of first memory devices 3221 to 322n may share the same channel (e.g., a first channel) or the same signal lines (e.g., first signal lines), and the plurality of second memory devices 3231 to 323n may share a second channel different from the first channel or second signal lines different from the second signal lines.

In some embodiments, signal distortion may be caused between the controller 3100 and the buffer chip 3210. Each of the buffer chip 3210 and the controller 3100 may perform the compensation operation (i.e., the ppDLL operation and the ppDCC operation on each data signal), as described above, to compensate for the signal distortion. Signal distortion may be caused between the buffer chip 3210 and the plurality of first memory devices 3221 to 322n and between the buffer chip 3210 and the plurality of second memory devices 3231 to 323n. Each of the buffer chip 3210, the plurality of first memory devices 3221 to 322n, and the plurality of second memory devices 3231 to 323n may perform the compensation operation (i.e., the ppDLL operation and the ppDCC operation on each data signal), as described above, to compensate for the signal distortion.

In some embodiments, the buffer chip 3210 may perform the compensation operation described with reference to FIGS. 15 to 18 in association with the plurality of first memory devices 3221 to 322n and may perform the compensation operation described with reference to FIGS. 15 to 18 in association with the plurality of second memory devices 3231 to 323n.

Figure 22:
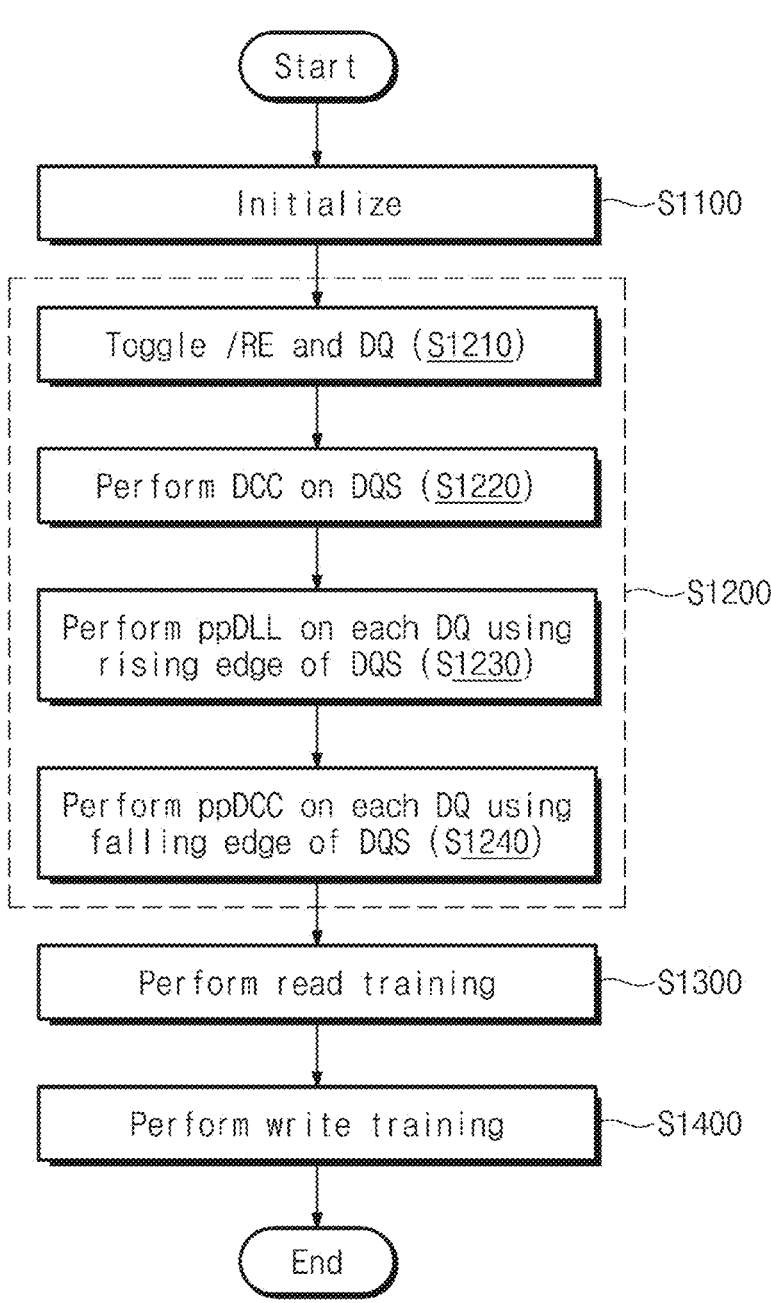
FIG. 22 is a flowchart illustrating an operation of a storage device according to embodiments of the present disclosure.

FIG. 22 is a flowchart illustrating an operation of a storage device according to embodiments of the present disclosure. For convenience, the description will be given as an operation according to the flowchart of FIG. 22 as performed by the storage device 100 of FIG. 1.

Referring to FIGS. 1 and 22, in operation S1100, the storage device 100 may perform initialization. For example, the storage device 100 may be powered on after power-off. In this case, the storage device 100 may perform the initialization operation. As an example, the initialization operation may include an operation such as ZQ calibration, read/write setting, or UIB setting (or device information setting).

After the initialization, the storage device 100 may perform DQ training. As an example, the DQ training may include operation S1200, operation S1300, and operation S1400.

In operation S1200, the storage device 100 may perform DCC training. The DCC training may refer to an operation for compensating for the mismatch of the duty ratio of the read enable signal/RE. As an example, during the DCC training, the storage device 100 according to embodiments of the present disclosure may perform the ppDLL operations and the ppDCC operations on the plurality of data signals DQ in parallel or at the same time.

For example, operation S1200 may include operation S1210 to operation S1240. In operation S1210, the storage device 100 may allow the read enable signal/RE and the data signals DQ to toggle. For example, the controller 110 may transmit the read enable signal/RE to the memory device 120. The memory device 120 may generate the data strobe signal DQS based on the read enable signal/RE. The memory device 120 may output the plurality of data signals DQ in synchronization with the data strobe signal DQS.

In operation S1220, the storage device 100 may perform the DCC operation on the data strobe signal DQS. For example, the controller 110 may receive the data strobe signal DQS from the memory device 120 and may perform the DCC operation for controlling the duty ratio of the received data strobe signal DQS.

In operation S1230, the storage device 100 may perform the ppDLL operations on the plurality of data signals DQ based on the rising edge of the data strobe signal DQS. For example, the controller 110 may perform the ppDLL operations on the plurality of data signals DQ based on the method described with reference to FIGS. 1 to 21.

In operation S1240, the memory device 100 may perform the ppDCC operations on the plurality of data signals DQ based on the falling edge of the data strobe signal DQS. For example, the controller 110 may perform the ppDCC operations on the plurality of data signals DQ based on the method described with reference to FIGS. 1 to 21.

Afterwards, in operation S1300, the storage device 100 may perform a read training operation. In operation S1400, the storage device 100 may perform a write training operation. The read training operation and the write training operation may refer to operations for alignment of the data signals DQ and the data strobe signal DQS between the controller 110 and the memory device 120.

After operation S1400 is completed, the storage device 100 may perform a normal operation (e.g., a read operation a write operation).

As described above, during the DCC training operation, the storage device 100 according to embodiments of the present disclosure may perform the compensation operations (e.g., the ppDLL operations and the ppDCC operations) on a plurality of data signals in parallel or at the parallel time. Accordingly, because a separate additional time for the compensation operations on the plurality of data signals is not required, the performance and reliability of the storage device may be improved.

According to the present disclosure, a storage device may compensate for signal distortion of data signals by performing a per-pin delay locked loop operation and a per-pin duty cycle correction operation for each of the data signals. Accordingly, a controller configured to control a memory device with improved performance and reliability, an operation method of the controller, and a storage device including the memory device and the controller are provided.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An operation method of a controller which is configured to communicate with a plurality of memory devices, the method comprising:

receiving a first reception signal, a second reception signal, and a data strobe signal through a first signal pin, a second signal pin, and a third signal pin, respectively;

generating a first delay signal by performing a first per-pin delay locked loop (ppDLL) operation on the first reception signal based on a rising edge of the data strobe signal;

generating a second delay signal by performing a second ppDLL operation on the second reception signal based on the rising edge of the data strobe signal; and generating a first correction signal by performing a first per-pin duty cycle correction (ppDCC) operation on the first delay signal based on a falling edge of the data strobe signal and generating a second correction signal by performing a second ppDCC operation on the second delay signal based on the falling edge of the data strobe signal, wherein a first rising edge of the first correction signal and a second rising edge of the second correction signal are aligned with the rising edge of the data strobe signal, and wherein a first falling edge of the first correction signal and a second falling edge of the second correction signal are aligned with the falling edge of the data strobe signal.

2. The method of claim 1, wherein, during the first ppDCC operation, a rising edge of the first delay signal is maintained to align with the rising edge of the data strobe signal, and wherein, during the second ppDCC operation, a rising edge of the second delay signal is maintained to align with the rising edge of the data strobe signal.

3. The method of claim 1, wherein the first ppDLL operation, the second ppDLL operation, the first ppDCC operation, and the second ppDCC operation are performed during DCC training.

4. The method of claim 3, further comprising:

before the DCC training, performing ZQ calibration; and after the DCC training, performing read training and write training.

5. The method of claim 1, further comprising:

before the first ppDLL operation and the second ppDLL operation, controlling a duty ratio of the data strobe signal by performing a DCC operation on the data strobe signal.

6. The method of claim 1, further comprising:

transmitting a read enable signal to each of the plurality of memory devices.

7. The method of claim 6, wherein the data strobe signal is generated based on the read enable signal by a first memory device among the plurality of memory devices, and wherein each of the first reception signal and the second reception signal is a toggle signal output from the first memory device.

8. The method of claim 6, wherein the data strobe signal is generated based on the read enable signal by a first memory device among the plurality of memory devices, wherein the first reception signal is a toggle signal output from the first memory device, and wherein the second reception signal is a toggle signal output from a second memory device among the plurality of memory devices.

9. The method of claim 1, further comprising:

generating a first DLL code by the first ppDLL operation;

generating a second DLL code by the second ppDLL operation;

generating a first DCC code by the first ppDCC operation;

generating a second DCC code by the second ppDCC operation; and storing the first DLL code, the second DLL code, the first DCC code, and the second DCC code in a storage circuit.

10. The method of claim 9, wherein, in a normal operation of the controller, the method further comprises:

receiving a first data signal and a second data signal through the first signal pin and the second signal pin, respectively;

performing first compensation on the first data signal based on the first DLL code and the first DCC code stored in the storage circuit and performing second compensation on the second data signal based on the second DLL code and the second DCC code stored in the storage circuit; and identifying first data based on a first data signal on which the first compensation is performed and identifying second data based on a second data signal on which the second compensation is performed.

11. A controller which is configured to control a memory device, the controller comprising:

a data strobe driver configured to receive a data strobe signal from the memory device through a data strobe signal line;

a first data driver configured to receive a first data signal from the memory device through a first data line;

a first data adjuster configured to perform a compensation operation on an output of the first data driver; and a first data sampler configured to sample the first data signal in response to the data strobe signal, wherein the first data adjuster performs a first per-pin delay locked loop (ppDLL) operation and a first per-pin duty cycle correction (ppDCC) operation on the output of the first data driver based on an output of the first data sampler.

12. The controller of claim 11, wherein the first ppDLL operation and the first ppDCC operation are performed during a DCC training operation.

13. The controller of claim 11, wherein the first data adjuster includes:

a first delay locked loop circuit configured to perform the first ppDLL operation on a first reception signal received from the first data line based on a first DLL code and to output a first delay signal;

a first duty cycle correction circuit configured to perform the first ppDCC operation on the first delay signal based on a first DCC code and to output a first correction signal;

a first DLL control circuit configured to generate the first DLL code based on the output of the first data sampler; and a first DCC control circuit configured to generate the first DCC code based on the output of the first data sampler.

14. The controller of claim 13, wherein the first data sampler includes:

a first even-numbered flip-flop configured to sample the first correction signal in response to a rising edge of the data strobe signal; and a first odd-numbered flip-flop configured to sample the first correction signal in response to a rising edge of an inverse data strobe signal being an inverted version of the data strobe signal, wherein the first DLL control circuit generates the first DLL code based on an output of the first even-numbered flip-flop, and wherein the first DCC control circuit generates the first DCC code based on an output of the first odd-numbered flip-flop.

15. The controller of claim 14, wherein the first reception signal is provided from the memory device in synchronization with the data strobe signal.

16. The controller of claim 11, further comprising:

a read enable driver configured to output a read enable signal to the memory device, wherein the data strobe signal is generated based on the read enable signal by the memory device.

17. A storage device comprising:

a first memory device connected to a first data line and a second data line;

a second memory device connected to the first data line and the second data line; and a controller connected to the first data line and the second data line, and configured to control the first and second memory devices, wherein the controller is further configured to:

receive a first reception signal from the first memory device through the first data line;

receive a second reception signal from the second memory device through the second data line;

perform a first per-pin delay locked loop (ppDLL) operation and a first per-pin duty cycle correction (ppDCC) operation on the first reception signal; and perform a second ppDLL operation and a second ppDCC operation on the second reception signal, and wherein the first ppDLL operation and the second ppDLL operation are simultaneously performed, and the first ppDCC operation and the second ppDCC operation are simultaneously performed.

18. The storage device of claim 17, wherein the controller is further configured to receive a data strobe signal from the first memory device through a data strobe line.

19. The storage device of claim 18, wherein the first ppDLL operation and the second ppDLL operation are performed based on a rising edge of the data strobe signal, and wherein the first ppDCC operation and the second ppDCC operation are performed based on a falling edge of the data strobe signal.

20. The storage device of claim 17, wherein the first ppDLL operation, the second ppDLL operation, the first ppDCC operation, and the second ppDCC operation are performed during DCC training.

* * * * *